(12) United States Patent
Kim et al.

(10) Patent No.: US 12,471,451 B2
(45) Date of Patent: Nov. 11, 2025

(54) DISPLAY DEVICE

(71) Applicant: Samsung Display Co., Ltd., Yongin-si (KR)

(72) Inventors: In-Bae Kim, Daejeon (KR); Jaechung Kim, Goyang-si (KR); Seungchan Lee, Hwaseong-si (KR); Jaeik Lim, Hwaseong-si (KR); Wonwoo Choi, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 530 days.

(21) Appl. No.: 17/900,207

(22) Filed: Aug. 31, 2022

(65) Prior Publication Data

US 2023/0113895 A1    Apr. 13, 2023

(30) Foreign Application Priority Data

Oct. 7, 2021   (KR) .................. 10-2021-0133418

(51) Int. Cl.
| | |
|---|---|
| *H01L 27/32* | (2006.01) |
| *H10K 50/844* | (2023.01) |
| *H10K 59/122* | (2023.01) |
| *H10K 59/123* | (2023.01) |
| *H10K 59/40* | (2023.01) |

(52) U.S. Cl.
CPC ......... *H10K 59/123* (2023.02); *H10K 50/844* (2023.02); *H10K 59/122* (2023.02); *H10K 59/40* (2023.02)

(58) Field of Classification Search
None
See application file for complete search history.

(56) References Cited

U.S. PATENT DOCUMENTS

| | | | |
|---|---|---|---|
| 7,678,591 B2 * | 3/2010 | Illek ..................... | H10H 20/831 |
| | | | 372/50.123 |
| 11,119,592 B2 | 9/2021 | Lee et al. | |
| 2006/0038200 A1 * | 2/2006 | Lee .................... | H10D 30/0275 |
| | | | 257/E29.267 |

(Continued)

FOREIGN PATENT DOCUMENTS

| | | |
|---|---|---|
| KR | 1020160002337 A | 1/2016 |
| KR | 101795428 B1 | 11/2017 |
| KR | 1020190042132 A | 4/2019 |

(Continued)

*Primary Examiner* — William C Trapanese
(74) *Attorney, Agent, or Firm* — CANTOR COLBURN LLP

(57) ABSTRACT

A display device includes a base layer, a circuit layer including a reinforcing layer disposed on the base layer and transistors disposed on the reinforced layer, where each of the transistors includes a semiconductor pattern including a source, an active, a drain, and a gate, and a display layer including a light-emitting diode connected to the transistors, where the reinforcing layer overlaps three or more actives among actives of the transistors. Some of semiconductor patterns of the transistors include polysilicon, others of the semiconductor patterns of the transistors include oxide, and a distance from the reinforcing layer to a semiconductor pattern including the polysilicon is shorter than a distance from the reinforcing layer to a semiconductor pattern including the oxide.

20 Claims, 14 Drawing Sheets

(56) References Cited

U.S. PATENT DOCUMENTS

2020/0203382 A1* 6/2020 Jung ................... G09G 3/3266
2020/0227494 A1* 7/2020 Bae ..................... H10K 59/124

FOREIGN PATENT DOCUMENTS

| KR | 1020190095633 A | 8/2019 |
| KR | 1020200089380 A | 7/2020 |
| KR | 1020210085748 A | 7/2021 |

* cited by examiner

DISPLAY DEVICE

This application claims priority to Korean Patent Application No. 10-2021-0133418, filed on Oct. 7, 2021, and all the benefits accruing therefrom under 35 U.S.C. § 119, the content of which in its entirety is herein incorporated by reference.

BACKGROUND

1. Field

The disclosure herein relates to a display device, and more particularly, to a display device having improved durability.

2. Description of the Related Art

A display device is activated according to an electrical signal. The display device may include or be composed of various layers, such as a display panel configured to display an image and an input sensing layer configured to sense an external input. The components of the display device may be electrically connected to each other by variously signal lines arranged therein.

SUMMARY

The disclosure provides a display device including a display panel having improved durability.

An embodiment of the invention provides a display device including: a base layer; a circuit layer including a reinforcing layer disposed on the base layer and transistors disposed on the reinforced layer, where each of the transistors includes a semiconductor pattern including a source, an active, a drain, and a gate; and a display layer including a light-emitting diode connected to the transistors. In such an embodiment, some of semiconductor patterns of the transistors include polysilicon, others of the semiconductor patterns of the transistors include oxide, the reinforcement layer overlaps three or more actives among actives of the transistors, and the distance from the reinforcing layer to a semiconductor pattern including the polysilicon is shorter than the distance from the reinforcing layer to a semiconductor pattern including the oxide.

In an embodiment, the circuit layer may include a barrier layer disposed between the base layer and the reinforcing layer, a buffer layer disposed on the reinforcing layer, and first to seventh insulating layers sequentially stacked above the buffer layer.

In an embodiment, the transistors may include first to seventh transistors, a semiconductor pattern included in each of the first transistor, the second transistor, the fifth transistor, the sixth transistor, and the seventh transistor may be disposed on the buffer layer, and a semiconductor pattern included in each of the third transistor and the fourth transistor may be disposed on a third insulating layer.

In an embodiment, the semiconductor pattern of each of the first transistor, the second transistor, the fifth transistor, the sixth transistor, and the seventh transistor may include the polysilicon.

In an embodiment, the semiconductor pattern of each of the third transistor and the fourth transistor may include the oxide.

In an embodiment, the first transistor, the second transistor, the fifth transistor, the sixth transistor, and the seventh transistor may be P-type transistors, and the third transistor and the fourth transistor may be N-type transistors.

In an embodiment, the reinforcing layer may include first to third patterns arranged in one direction, where each of the first pattern and the second pattern may overlap any one of the P-type transistors and the third pattern may overlap any one of the N-type transistors.

In an embodiment, the reinforcing layer may not overlap at least one selected from the second transistor, the third transistor, the fifth transistor, and the seventh transistor.

In an embodiment, the first transistor may be a driving transistor.

In an embodiment, the light-emitting diode may include a first electrode, a second electrode, and a light-emitting layer disposed between the first electrode and the second electrode, the display layer may include a pixel defining layer through which an opening is defined to expose at least a portion of the first electrode, and the reinforcing layer may overlap a portion of the opening.

In an embodiment, the display device may further include a thin film encapsulation layer covering the light-emitting diode and disposed on the display layer, and the thin film encapsulation layer may include inorganic layers and an organic layer disposed between the inorganic layers.

In an embodiment, the display device may further include an input sensing layer disposed on the thin film encapsulation layer, where the input sensing layer may include sensing insulating layers and conductive patterns spaced apart from the opening and overlapping the pixel defining layer.

In an embodiment, the reinforcing layer may include a metal.

In an embodiment of the invention, a display device includes: a base layer; a reinforcing layer disposed on the base layer; insulating layers disposed on the reinforcing layer; transistors which are disposed between the insulating layers, where each of transistors includes a semiconductor pattern including a source, an active, a drain, and a gate, at least one of the transistors is a P-type and the others of the transistors are N-types; and a light-emitting diode connected to the transistors, where a number of actives of the P-type transistors overlapping the reinforcing layer is greater than a number of actives of the N-type transistors overlapping the reinforcing layer.

In an embodiment, insulating layers between which the semiconductor pattern included in the P-type transistors is disposed may be different from insulating layers between which the semiconductor pattern included in the N-type transistors is disposed.

In an embodiment, the transistors may include first to seventh transistors, wherein the first transistor, the second transistor, the fifth transistor, the sixth transistor, and the seventh transistor may be P-type transistors, and the third transistor and the fourth transistor may be N-type transistors.

In an embodiment, the semiconductor pattern included in each of the P-type transistors may include polysilicon, and the semiconductor pattern included in each of the N-type transistors may include oxide.

In an embodiment, the reinforcing layer may not overlap at least one selected from the second transistor, the third transistor, the fifth transistor, and the seventh transistor.

In an embodiment, the reinforcing layer may include a metal.

In an embodiment, the transistors and the light-emitting diode may collectively define one pixel, and shapes of portions of the reinforcing layer disposed in adjacent pixels may be symmetrical to each other.

BRIEF DESCRIPTION OF THE DRAWINGS

The above and other features of the invention will become more apparent by describing in further detail embodiments thereof with reference to the accompanying drawings, in which.

FIG. TA is a perspective view illustrating a display device in an unfolded state according to an embodiment of the invention.

DETAILED DESCRIPTION

Figure 1A:
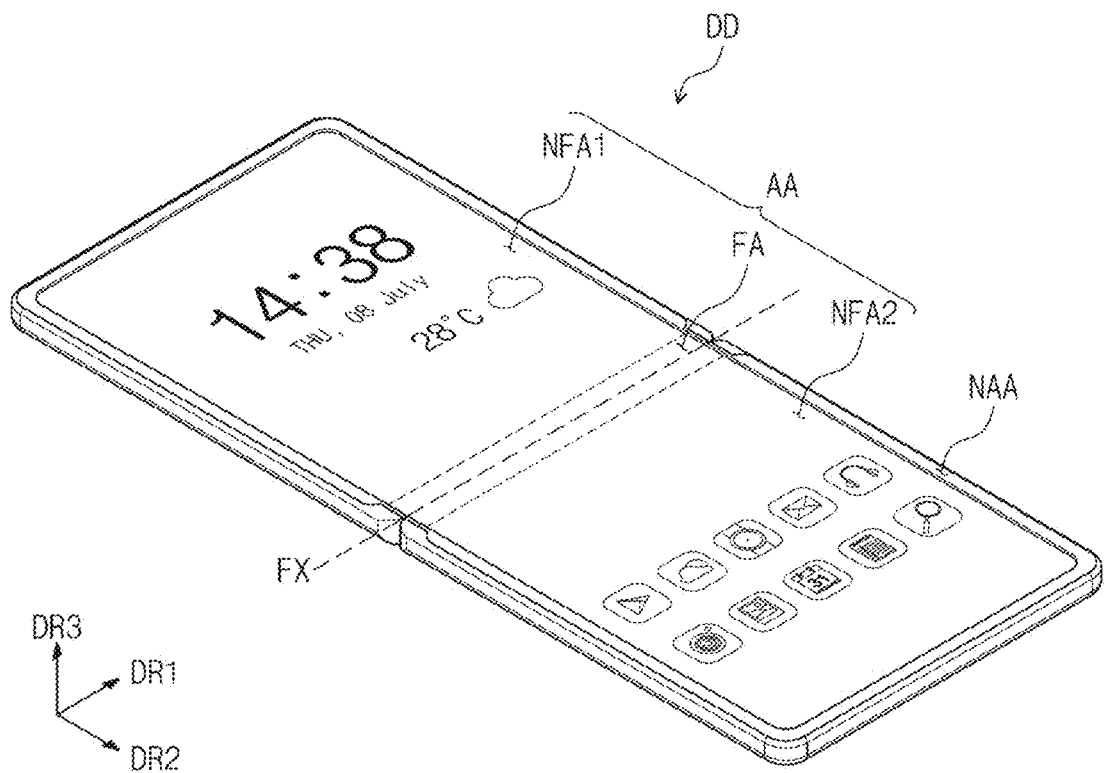
FIG. 1B is a perspective view illustrating the display device in a folded state according to an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In this specification, it will be understood that when an element (or region, layer, part, etc.) is referred to as being "on", "connected to" or "coupled to" another element, it can be directly on, connected or coupled to the other element, or intervening elements may be present. In contrast, when an element is referred to as being "directly on" another element, there are no intervening elements present.

Like reference numerals refer to like elements throughout. In addition, in the drawings, the thicknesses, ratios, and dimensions of elements are exaggerated for effective description of the technical contents. As used herein, the term "and/or" includes any and all combinations that the associated configurations can define.

It will be understood that, although the terms first, second, etc. may be used herein to describe various elements, these elements should not be limited by these terms. These terms are only used to distinguish one element from another element. In an embodiment, for example, a first element could be termed a second element without departing from the scope of the invention. Similarly, the second element may also be referred to as the first element. The terms of a singular form include plural forms unless otherwise specified.

In addition, terms, such as "below", "lower", "above", "upper" and the like, are used herein for ease of description to describe one element's relation to another element(s) as illustrated in the figures. The above terms are relative concepts and are described based on the directions indicated in the drawings.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

Figure 1B:
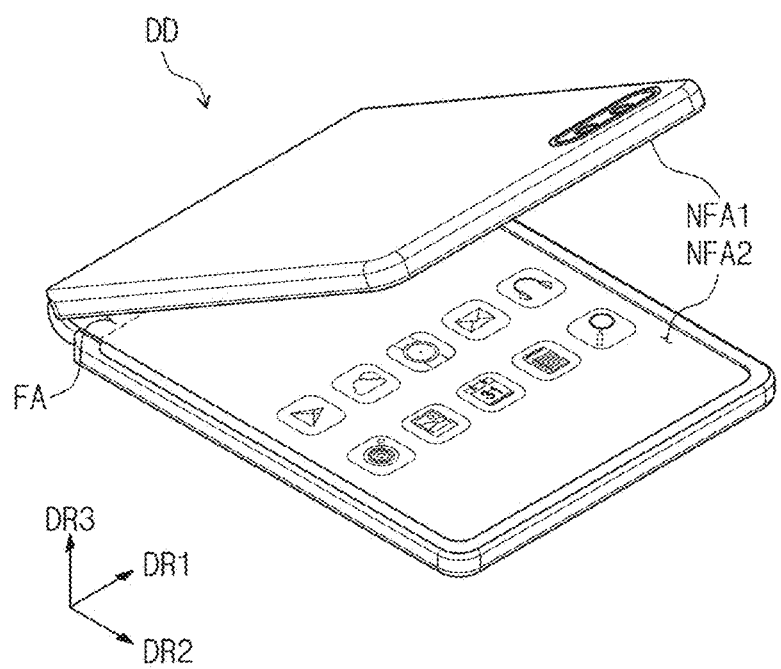

FIG. TA is a perspective view illustrating a display device in an unfolded state according to an embodiment of the invention. FIG. 1B is a perspective view illustrating the display device in a folded state according to an embodiment of the invention.

Referring to FIGS. TA and 1B, an embodiment of the display device DD the invention may be activated according to an electrical signal. In an embodiment, for example, the display device DD may be a mobile phone, a tablet, a car navigation system, a game machine, or a wearable device, but the embodiment of the invention is not limited thereto. FIG. 1A illustrates an embodiment where the display device DD is a mobile phone.

The display device DD may display an image through an active region AA and sense an external input. When the display device DD is in an unfolded (spread-out) state, the active region AA may include a surface on a plane defined by a first direction DR1 and a second direction DR2. The thickness direction of the display device DD may be defined as a third direction DR3 perpendicular to each of the first direction DR1 and the second direction DR2. Accordingly, the front surface (or upper surface) and the rear surface (or lower surface) of the members constituting the display device DD may be defined based on the third direction DR3.

A peripheral region NAA may surround at least a portion of the active region AA. The peripheral region NAA may be defined by a bezel pattern printed on a window or provided in the form of a tape. The bezel pattern may include a predetermined color.

Although FIG. 1A illustrates an embodiment where the peripheral region NAA surrounds the four sides of the active region AA, the embodiment of the invention is not limited thereto. Alternatively, the peripheral region NAA may not be disposed on at least one side of the active region AA, or the peripheral region NAA may be omitted.

An embodiment of the display device DD according to the invention may include a folding region FA and non-folding regions NFA1 and NFA2 spaced apart from each other along the second direction DR2 with the folding region FA interposed therebetween. The folding region FA may be folded based on a virtual folding axis FX extending along the first direction DR1.

When the display device DD is folded or in a folded state, a first non-folding region NFA1 and a second non-folding region NFA2 may face each other. Accordingly, in a state in which the display device DD is completely folded, the active region AA may not be exposed to the outside, and this may be referred to as in-folding. However, this is an example, and the operation of the display device DD is not limited thereto.

In an embodiment of the invention, for example, when the display device DD is folded or in a folded state, the first non-folding region NFA1 and the second non-folding region NFA2 may be opposed to each other. Accordingly, in a state in which the display device DD is folded, the active region AA may be exposed to the outside, and this may be referred to as out-folding.

In an embodiment, the display device DD may perform only an in-folding operation or an out-folding operation. Alternatively, the display device DD may perform both in-folding and out-folding operations. In such an embodiment, a same region of the display device DD, for example, the folding region FA may be in-folded and out-folded. Alternatively, a partial region of the display device DD may be in-folded, and another partial region thereof may be out-folded.

FIGS. 1A and 1B illustrate an embodiment including a single folding region FA and two non-folding regions NFA1 and NFA2, but the number of the folding regions and the number of the non-folding regions are not limited thereto. In an alternative embodiment, for example, the display device DD may include more than two non-folding regions and a plurality of folding regions disposed between adjacent non-folding regions.

FIGS. TA and 1B illustrate an embodiment where a folding axis FX is parallel to the short axis of the display device DD, which extends in the first direction DRT, but the embodiment of the invention is not limited thereto. In an alternative embodiment, for example, the folding axis FX may be parallel to the long axis of the display device DD, which extends in the second direction DR2. such an embodiment, the first non-folding region NFA1, the folding region FA, and the second non-folding region NFA2 may be sequentially arranged along the first direction DR1.

The appearance of the display device DD may be defined by the combination of a case and a window WM. The case may be provided in plural according to the number of the non-folding regions and further include a hinge structure, which connects the cases and overlaps the folding region, such that the display device may be easily folded.

In an embodiment, the display device DD may sense an external input applied from the outside. The external input may include various types of inputs which are provided from the outside of the display device DD. In an embodiment, for example, the external input may include not only a touch by a part of a body such as a user's hand, but also various forms of external inputs (e.g., hovering) applied at a place close to the display device DD or at a predetermined adjacent distance from the display device DD. In such an embodiment, the external input may include various forms of inputs such as force, pressure, temperature, light, and the like.

Figure 2:
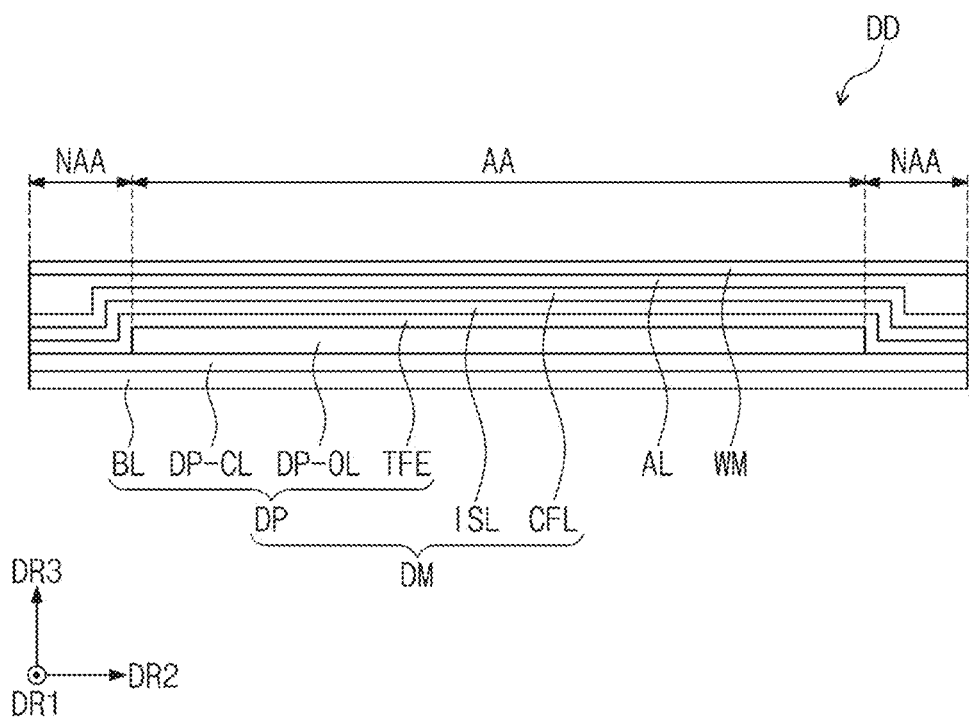
FIG. 2 is a cross-sectional view of the display device according to an embodiment of the invention.

FIG. 2 is a cross-sectional view of the display device according to an embodiment of the invention.

Referring to FIG. 2, an embodiment of the display device DD may include a window WM and a display module DM. The display module DM may include a display panel DP, an input sensing layer ISL, and a filter layer CFL. The window WM and the display module DM may be coupled to each other by an adhesive layer AL disposed between the window WM and the display module DM. In an embodiment, the adhesive layer AL may include at least one of an optical clear adhesive, an optically clear adhesive resin, or a pressure sensitive adhesive ("PSA").

The front surface of the window WM defines the active region AA of the display device DD. The window WM may include an optically transparent insulating material. In an embodiment, for example, the window WM may include glass or plastic. The window WM may have a multi-layered structure or a single-layered structure. In an embodiment, for example, the window WM may include a plurality of plastic films bonded to each other by an adhesive, or a glass substrate and a plastic film bonded to each other by an adhesive.

The display panel DP may be configured to substantially generate an image. The display panel DP may be a light-emitting display panel. In an embodiment, for example, the display panel DP may be an organic light-emitting display panel, an inorganic light-emitting display panel, an organic-inorganic light-emitting display panel, a quantum dot display panel, a micro light emitting diode ("LED") display panel, or a nano LED display panel.

The display panel DP may include a base layer BL, a circuit layer DP-CL, a display layer DP-OL, and an encapsulation layer TFE.

The base layer BL may be a basal or support layer on which other components of the display panel DP are disposed. The base layer BL may include or be made of a flexible material.

The circuit layer DP-CL is disposed on the base layer BL. The circuit layer DP-CL includes at least one insulating layer and a circuit element. The insulating layer includes at least one inorganic layer and at least one organic layer. The circuit element may include a pixel driving circuit and the like included in each of a plurality of pixels configured to display an image. The display layer DP-OL may include a light-emitting diode connected to the circuit layer DP-CL.

In an embodiment, the circuit layer DP-CL may include a metal layer configured to supplement the rigidity of the display device DD. When a neutral plane is formed in the input sensing layer ISL of the display module DM by external pressure, the metal layer is disposed under a layer to which tensile stress is applied by external pressure so that the rigidity of the display device DD may be improved, which will be described later in greater detail.

The encapsulation layer TFE seals the display layer DP-OL. The encapsulation layer TFE may include at least one organic film and inorganic films which seals the organic film. The inorganic film may include an inorganic material and protect the display layer DP-OL from moisture/oxygen.

The inorganic film may include a silicon nitride layer, a silicon oxynitride layer, a silicon oxide layer, a titanium oxide layer, an aluminum oxide layer, or the like, but the embodiment of the invention is not particularly limited thereto. The organic film may include an organic material and protect the display layer DP-OL from foreign substances such as dust particles. The organic film may include an acryl-based organic material, but the embodiment of the invention is not particularly limited thereto.

The input sensing layer ISL may be disposed on the display panel DP. The input sensing layer ISL may sense an external input applied from the outside. The external input may be a user's input. The user's input may include various types of external inputs, such as a part of the user's body, light, heat, a pen, or pressure.

In an embodiment, the input sensing layer ISL may be formed on the display panel DP through a continuous process. In such an embodiment, the input sensing layer ISL may be disposed directly on the display panel DP.

Being 'directly disposed' may mean that a third component is not disposed between the input sensing layer ISL and the display panel DP. That is, a separate adhesive member may not be disposed between the input sensing layer ISL and the display panel DP. Alternatively, the input sensing layer ISL may be coupled to the display panel DP by an adhesive member. The adhesive member may include a conventional adhesive or a glue agent.

The filter layer CFL may be disposed on the input sensing layer ISL. The filter layer CFL may include an anti-reflection layer that reduces the reflectivity of external light incident from the outside of the display device DD. However, the embodiment of the invention is not limited thereto, and the filter layer CFL may include a color filter capable of selectively transmitting light corresponding to the light provided from the display panel DP.

Figure 3:
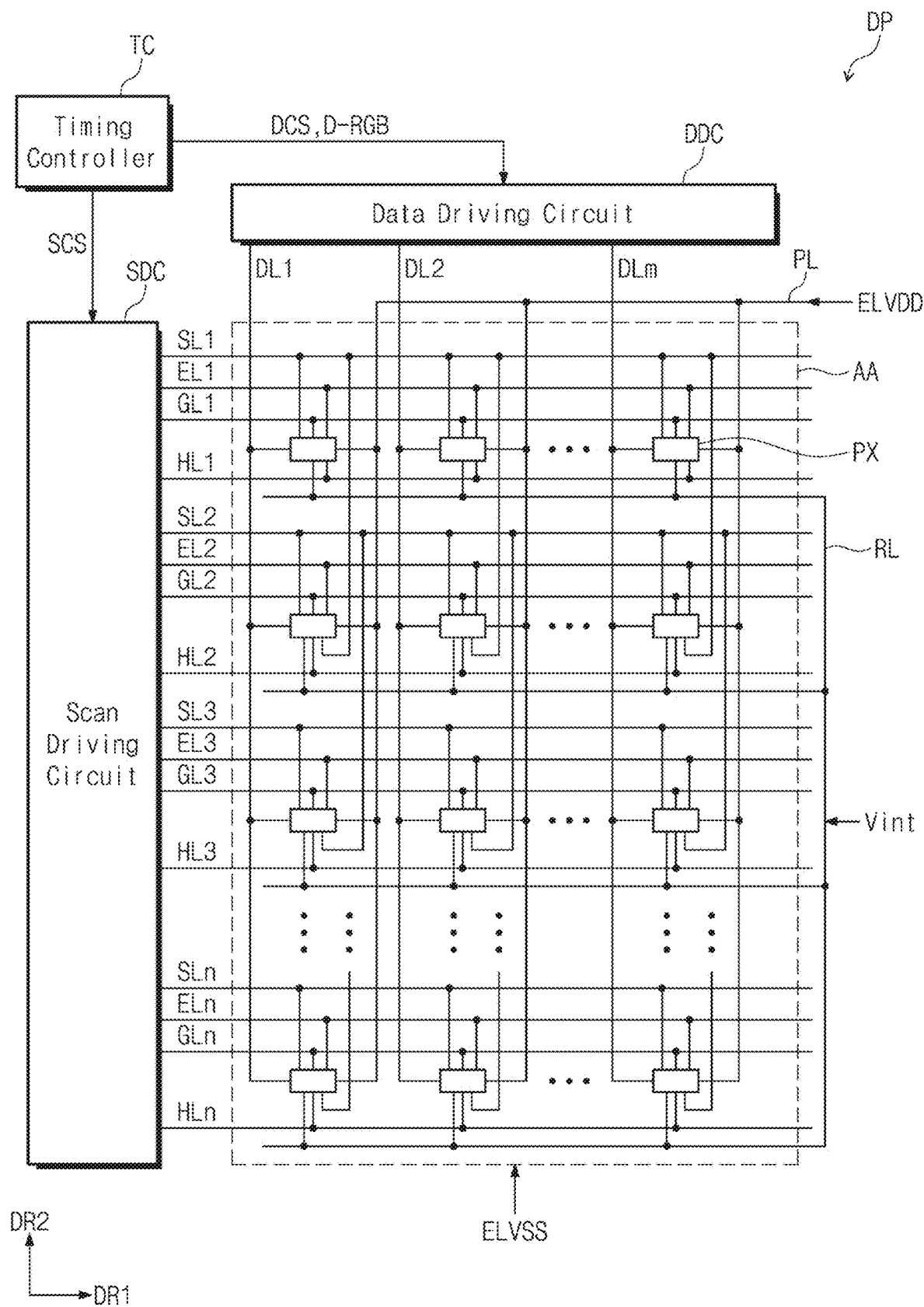
FIG. 3 is a block diagram of the display device according to an embodiment of the invention.

FIG. 3 is a block diagram of the display device according to an embodiment of the invention.

In an embodiment, the display panel DP may include a timing controller TC, a scan driving circuit SDC, a data driving circuit DDC, and a pixel PX overlapping the active region AA. In an embodiment, the display panel DP may be an organic light-emitting display panel among various types of light-emitting display panel.

The timing controller TC receives input image signals, converts the data format of the input image signals to meet the interface specification with the scan driving circuit SDC, and generates image data D-RGB. The timing controller TC outputs image data D-RGB and various control signals DCS and SCS.

The scan driving circuit SDC receives a scan control signal SCS from the timing controller TC. The scan control signal SCS may include a vertical start signal for starting the operation of the scan driving circuit SDC, a clock signal for determining the output timing of signals, and the like. The scan driving circuit SDC generates a plurality of scan signals and sequentially outputs the scan signals to corresponding signal lines SL1 to SLn and GL1 to GLn. In addition, the scan driving circuit SDC generates a plurality of light-emitting control signals in response to the scan control signal SCS and outputs the plurality of light-emitting control signals to corresponding light-emitting lines ELi to ELn.

Although FIG. 3 illustrates an embodiment where a plurality of scan signals and a plurality of light-emitting control signals are output from a same scan driving circuit SDC, the embodiment of the invention is not limited thereto. In an alternative embodiment of the invention, a plurality of scan driving circuits may divide, generate, and then output scan signals, and divide, generate, and then output a plurality of light-emitting control signals. In an embodiment of the invention, a scan driving circuit configured to generate and output a plurality of scan signals and a scan driving circuit configured to generate and output a plurality of light-emitting control signals may be separately defined or distinguished from each other.

The data driving circuit DDC receives a data control signal DCS and image data D-RGB from the timing controller TC. The data driving circuit DDC converts the image data D-RGB into data signals and outputs the data signals to a plurality of data lines DL1 to DLm to be described later. Here, m is a natural number. The data signals are analog voltages corresponding to the gradation values of the image data D-RGB.

The display panel DP includes a first group of scan lines SL1 to SLn, a second group of scan lines GL1 to GLn, a third group of scan lines HL1 to HLn, light-emitting lines ELi to ELn, data lines DL1 to DLm, a first voltage line PL, a second voltage line RL, and a plurality of pixels PX. Here, n is a natural number. The first group of scan lines SL1 to SLn, the second group of scan lines GL1 to GLn, the third group of scan lines HL1 to HLn, and the light-emitting lines ELi to ELn extend in the first direction DR1 and are arranged in the second direction DR2 crossing the first direction DR1.

The plurality of data lines DL1 to DLm are insulated from and cross the first group of scan lines SL1 to SLn, the second group of scan lines GL1 to GLn, the third group of scan lines HL1 to HLn, and the light-emitting lines ELi to ELn. Each of the plurality of pixels PX is connected to corresponding signal lines among the signal lines. The connection relationship between the pixels PX and the signal lines may be changed according to the configuration of the driving circuit of the pixels PX.

The first voltage line PL receives a first power voltage ELVDD. A second voltage line RL receives an initialization voltage Vint. The initialization voltage Vint has a lower level than the first power voltage ELVDD. A second power voltage ELVSS is applied to the light-emitting diode OLED (refer to FIG. 4). The second power voltage ELVSS has a lower level than the first power voltage ELVDD.

The plurality of pixels PX may include a plurality of groups which generate different color lights. In an embodiment, for example, the plurality of pixels may include red pixels that generate red color light, green pixels that generate green color light, and blue pixels that generate blue color light. The light-emitting diode of the red pixel, the light-emitting diode of the green pixel, and the light-emitting diode of the blue pixel may include light-emitting layers including different materials from each other.

The pixel driving circuit may include a plurality of transistors and a capacitor electrically connected to the transistors. At least one selected from the scan driving circuit SDC or the data driving circuit DDC may include a plurality of transistors formed through a same process as that of the pixel driving circuit.

The signal lines, the plurality of pixels PX, the scan driving circuit SDC, and the data driving circuit DDC, which are described above, may be formed on a base substrate through a plurality of photolithography processes. A plurality of insulating layers may be formed on a base substrate through a plurality of deposition or coating processes. The plurality of insulating layers may be thin films disposed to correspond to the plurality of pixels PX, and some of the plurality of insulating layers may include an insulating pattern overlapping only a specific conductive pattern. The insulating layers include organic and/or inorganic layers.

Figure 4:
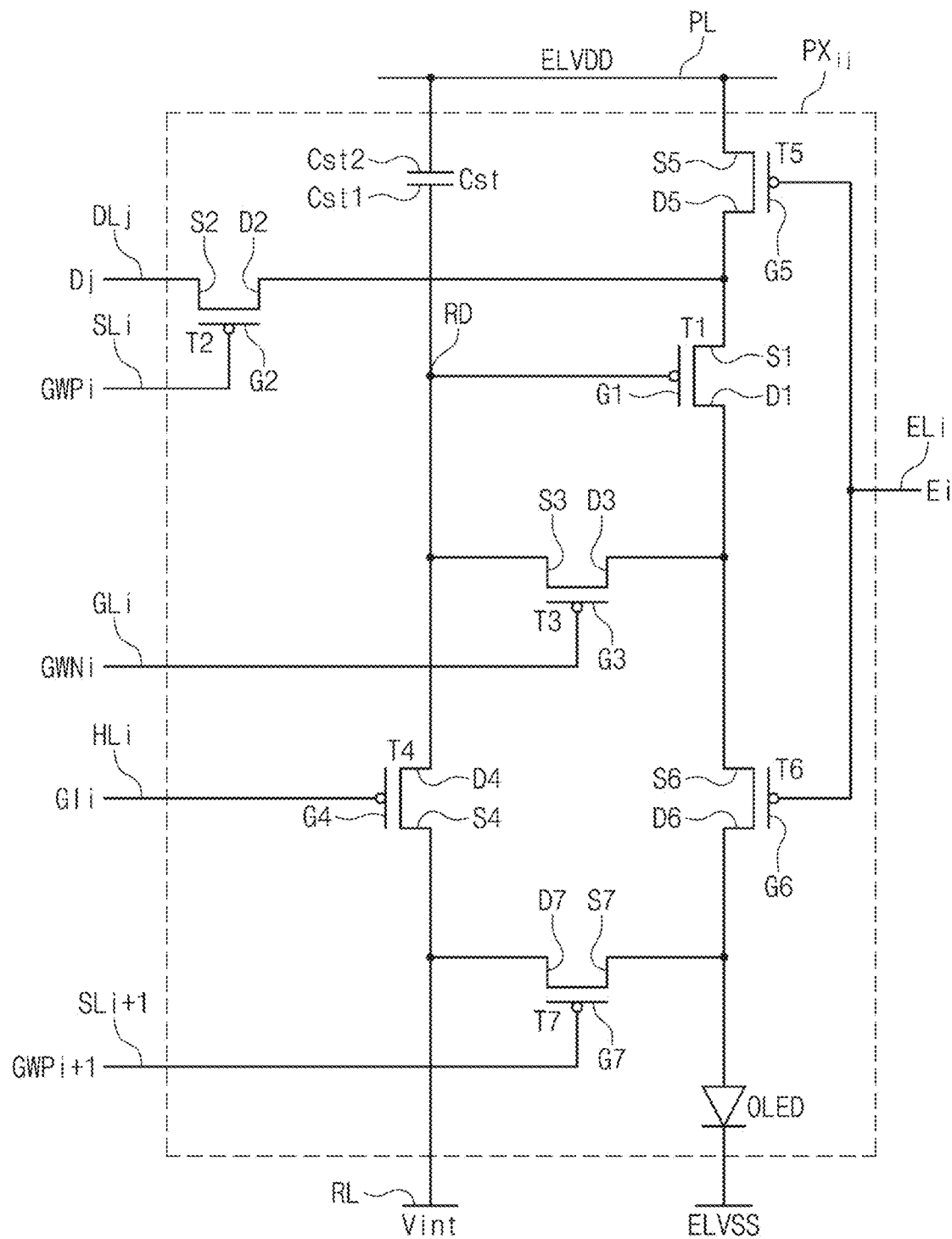
FIG. 4 is an equivalent circuit diagram of a pixel according to an embodiment of the invention.

FIG. 4 is an equivalent circuit diagram of a pixel according to an embodiment of the invention.

FIG. 4 illustrates an embodiment of a pixel PXij, which is connected to an i-th scan line SLi, which transmits an i-th scan signal GWPi of the first group, among the scan lines SL1 to SLn of the first group and to a j-th data line DLj, which transmits a j-th data signal Dj, among the plurality of data lines DL1 to DLm.

In an embodiment, as shown in FIG. 4, the pixel driving circuit may include first to seventh transistors T1 to T7 and a capacitor Cst. In such an embodiment, the first transistor T1, the second transistor T2, and the fifth to seventh transistors T5 to T7 may be P-type transistors, and the third transistor T3 and the fourth transistor T4 may be N-type transistors. However, the embodiment of the invention is not limited thereto, and alternatively, the first to seventh transistors T1 to T7 may be implemented as either a P-type transistor or an N-type transistor. In an embodiment of the invention, at least one selected from the first to seventh transistors T1 to T7 may be omitted.

In an embodiment, the first transistor T1 may be a driving transistor, and the second transistor T2 may be a switching transistor. The capacitor Cst is connected between the first voltage line PL, which receives the first power voltage ELVDD, and a reference node RD. The capacitor Cst includes a first electrode Cst1 connected to the reference node RD and a second electrode Cst2 connected to the first voltage line PL.

The first transistor T1 is connected between the first voltage line PL and one electrode of the light-emitting diode OLED. The source S1 of the first transistor T1 is electrically connected to the first voltage line PL. Another transistor may be further connected between the source S1 of the first transistor T1 and the first voltage line PL, or a transistor connected between the source S1 of the first transistor T1 and the first voltage line PL may be omitted.

The drain D1 of the first transistor T1 is electrically connected to a first electrode AE of the light-emitting diode OLED. Another transistor may be further connected between the drain D1 of the first transistor T1 and the first electrode AE of the light-emitting diode OLED, or a transistor connected between the drain D1 of the first transistor T1 and the first electrode AE of the light-emitting diode OLED may be omitted. The gate G1 of the first transistor T1 is electrically connected to the reference node RD.

The second transistor T2 is connected between the j-th data line DLj and the source S1 of the first transistor T1. The source S2 of the second transistor T2 is electrically connected to the j-th data line DLj, and the drain D2 of the second transistor T2 is electrically connected to the source S1 of the first transistor T1. In an embodiment, the gate G2 of the second transistor T2 may be electrically connected to the i-th scan line SLi of the first group.

The third transistor T3 is connected between the reference node RD and the drain D1 of the first transistor T1. The drain D3 of the third transistor T3 is electrically connected to the drain D1 of the first transistor T1, and the source S3 of the third transistor T3 is electrically connected to the reference node RD. In an embodiment, the gate G3 of the third transistor T3 may be electrically connected to an i-th scan line GLi of the second group, which transmits an i-th scan signal GWNi of the second group.

The fourth transistor T4 is connected between the reference node RD and the second voltage line RL. The drain D4 of the fourth transistor T4 is electrically connected to the reference node RD, and the source S4 of the fourth transistor T4 is electrically connected to the second voltage line RL. In an embodiment, the gate G4 of the fourth transistor T4 may be electrically connected to an i-th scan line HLi of the third group, which transmits an i-th scan signal GIi of the third group.

The fifth transistor T5 is connected between the first voltage line PL and the source S1 of the first transistor T1. The source S5 of the fifth transistor T5 is electrically connected to the first voltage line PL, and the drain D5 of the fifth transistor T5 is electrically connected to the source S1 of the first transistor T1. The gate G5 of the fifth transistor T5 may be electrically connected to the i-th light-emitting line ELi.

The sixth transistor T6 is connected between the drain D1 of the first transistor T1 and the light-emitting diode OLED. The source S6 of the sixth transistor T6 is electrically connected to the drain D1 of the first transistor T1, and the drain D6 of the sixth transistor T6 is electrically connected to the first electrode AE of the light-emitting diode OLED. The gate G6 of the sixth transistor T6 may be electrically connected to the i-th light-emitting line ELi.

The seventh transistor T7 is connected between the drain D6 of the sixth transistor T6 and the second voltage line RL. The source S7 of the seventh transistor T7 is electrically connected to the drain D6 of the sixth transistor T6, and the drain D7 of the seventh transistor T7 is electrically connected to the second voltage line RL. The gate G7 of the seventh transistor T7 may be electrically connected to an (i+1)-th scan line SLi+1 of the first group, which transmits an (i+1)-th scan signal GWPi+1 of the first group.

Figure 5:
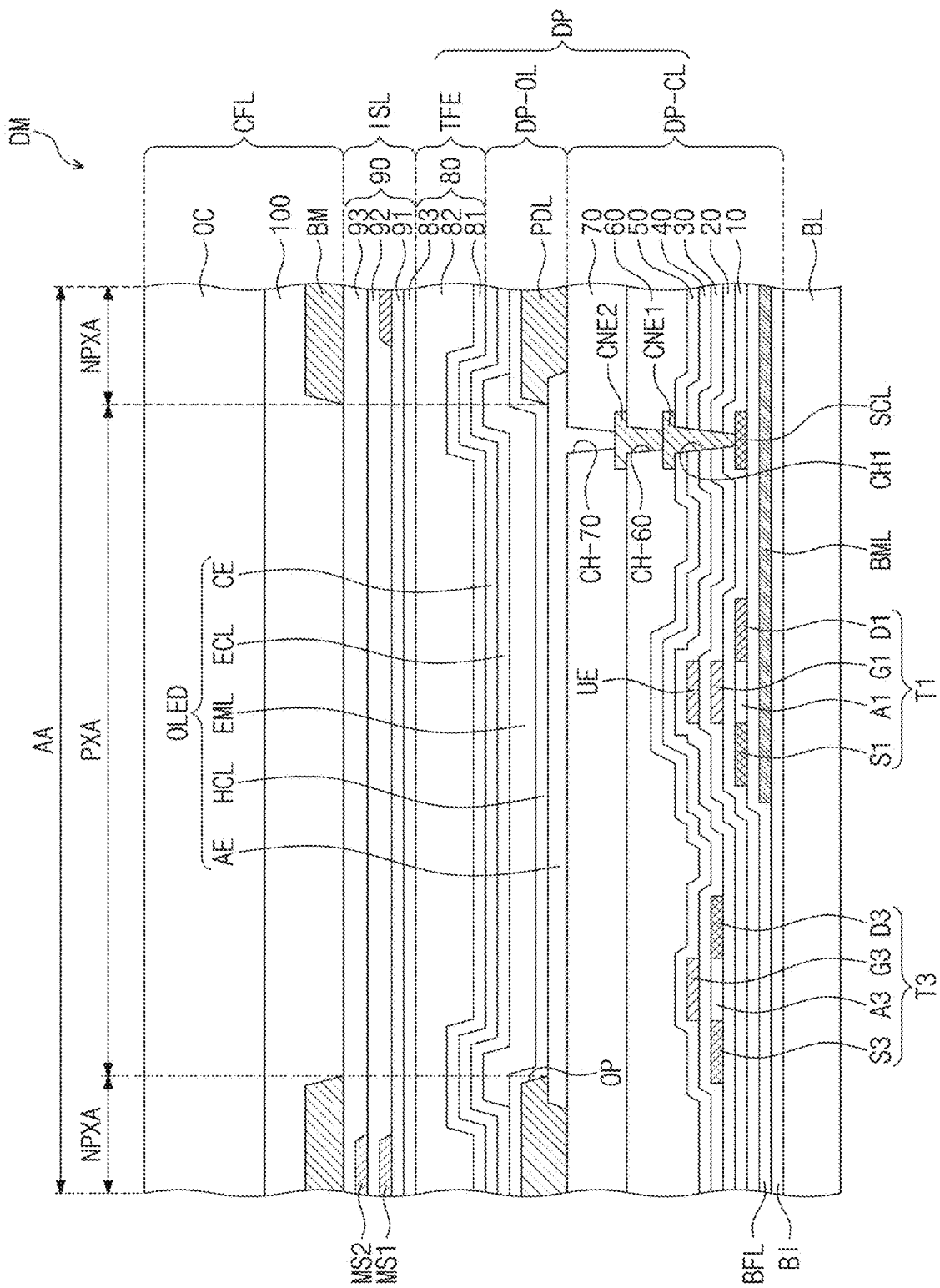
FIG. 5 is a cross-sectional view of a display module according to an embodiment of the invention.

FIG. 5 is a cross-sectional view of a display module according to an embodiment of the invention.

FIG. 5 is a cross-sectional view of a portion corresponding to the first transistor T1 and the third transistor T3 among the first to seventh transistors T1 to T7 described with reference to FIG. 4.

In an embodiment, the display module DM may include a display panel DP, an input sensing layer ISL, and a filter layer CFL. The display panel DP may include a base layer BL, a circuit layer DP-CL, a display layer DP-OL, and an encapsulation layer TFE.

The display panel DP may further include functional layers such as an anti-reflection layer and a refractive index control layer. The circuit layer DP-CL includes at least a plurality of insulating layers and a circuit element. In an embodiment, the insulating layers may include an organic layer and/or an inorganic layer.

In an embodiment, an insulating layer, a semiconductor layer, and a conductive layer are formed by coating, deposition, or the like. Thereafter, the insulating layer, the semiconductor layer, and the conductive layer may be selectively patterned through a photolithography process. In such an embodiment, a semiconductor pattern, a conductive pattern, a signal line, and the like are formed through such processes.

The base layer BL may include a synthetic resin film. The synthetic resin layer may include thermosetting resin. In an embodiment, the synthetic resin layer may be a polyimide-based resin layer, but the material thereof is not particularly limited thereto. The synthetic resin layer may include at least one selected from acrylic-based resin, methacrylic-based resin, polyisoprene, vinyl-based resin, epoxy-based resin, urethane-based resin, cellulose-based resin, siloxane-based resin, polyamide-based resin, and perylene-based resin. In an embodiment, the base layer may include a glass substrate, a metal substrate, an organic/inorganic composite material substrate, or the like.

The base layer BL may be provided in a form or have a structure in which organic layers and inorganic layers are alternately stacked one on another. In an embodiment, for example, a first organic layer including polyimide, a first inorganic layer, a second organic layer including polyimide, and a second inorganic layer may be provided in an alternately stacked structure, but the invention is not limited to any one embodiment.

The circuit layer DP-CL may include a plurality of insulating layers BI-70 and conductive patterns included in transistors.

A barrier layer BI may be disposed on the base layer BL. The barrier layer BI may include an inorganic material. In an embodiment, for example, the barrier layer BI may include at least one selected from aluminum oxide, titanium oxide, silicon oxide, silicon nitride, silicon oxynitride, zirconium oxide, and hafnium oxide. The barrier layer BI may be formed in multiple layers or have a multi-layered structure.

The barrier layer BI may prevent oxygen or moisture, which is introduced through the base layer BL, from penetrating into the pixel PX.

In an alternative embodiment of the invention, the barrier layer BI may be omitted in the circuit layer DP-CL, and the invention is not limited to any one embodiment.

A reinforcing layer BML may be disposed on the barrier layer BI. In an embodiment where the barrier layer BI is omitted, the reinforcing layer BML may be disposed directly on the base layer BL. In an embodiment, the reinforcing layer BML may include molybdenum.

In an embodiment, the reinforcing layer BML may have a shielding function. In such an embodiment, the reinforcing layer BML may block an electric potential due to polarization between insulating layers disposed on the reinforcing layer BML from affecting the first to seventh transistors T1 to T7.

In an embodiment, the reinforcing layer BML may be disposed in a region vulnerable to an external impact among the first to seventh transistors T1 to T7 to improve the durability of the display panel DP. In an embodiment, for example, when a neutral plane on which stress is not applied is formed in the input sensing layer ISL during an impact applied to the display module DM, as the neutral plane is placed at a lower position, the reinforcing layer BML may reduce the tensile stress which is applied to the conductive layers disposed between the input sensing layer ISL and the reinforcing layer BML. Accordingly, in such an embodiment, the display device DD having improved durability may be provided. The region in which the reinforcing layer BML is disposed will be described later.

A buffer layer BFL is disposed on the reinforcing layer BML. The buffer layer BFL may include an inorganic material. In an embodiment, for example, the buffer layer BFL may include at least one selected from aluminum oxide, titanium oxide, silicon oxide, silicon nitride, silicon oxynitride, zirconium oxide, and hafnium oxide. The buffer layer BFL may be formed in multiple layers. The buffer layer BFL may reduce the surface energy of the base layer BL so that the pixel PX is stably formed on the base layer BL.

A first semiconductor pattern of the first transistor T1 is disposed on the buffer layer BFL. The first semiconductor pattern may include a silicon semiconductor. In an embodiment, the first semiconductor pattern may include polysilicon. However, the embodiment of the invention is not limited thereto, and alternatively, the first semiconductor pattern may include amorphous silicon.

FIG. 5 illustrates only a portion of the first semiconductor pattern, and the first semiconductor pattern may be further disposed in another region of the pixel PXij (refer to FIG. 4). The first semiconductor pattern has different electrical properties depending on whether it is doped or not. The first semiconductor pattern may include a doped region and a non-doped region. The doped region may be doped with an N-type dopant or a P-type dopant. A P-type transistor includes a doped region doped with a P-type dopant.

The source S1, the active A1, and the drain D1 of the first transistor T1 are formed from or defined by the first semiconductor pattern. The source S1 and the drain D1 of the first transistor T1 are formed to be spaced apart from each other with the active A1 interposed therebetween.

A connection signal line SCL may be disposed on the buffer layer BFL. The connection signal line SCL may be connected to the sixth transistor T6 (refer to FIG. 3) on a plane.

A first insulating layer 10 may be disposed on the buffer layer BFL to cover the first semiconductor pattern and the connection signal line SCL. The first insulating layer 10 may be an inorganic layer and/or an organic layer and have a single-layered or multi-layered structure. The first insulating layer 10 may include at least one selected from aluminum oxide, titanium oxide, silicon oxide, silicon nitride, silicon oxynitride, zirconium oxide, and hafnium oxide.

The insulating layer of the circuit layer DP-CL to be described later may be an inorganic layer and/or an organic layer and have a single-layered or multi-layered structure. The inorganic layer may include at least one selected from the above-described materials.

The gate G1 of the first transistor T1 is disposed on the first insulating layer 10. The gate G1 may be a portion of a metal pattern. The gate G1 of the first transistor T1 overlaps the active A1 of the first transistor T1. In the process of doping the first semiconductor pattern, the gate G1 of the first transistor T1 may function as a mask.

A second insulating layer 20 is disposed on the first insulating layer 10 to cover the gate G1. The second insulating layer 20 may include at least one selected from aluminum oxide, titanium oxide, silicon oxide, silicon nitride, silicon oxynitride, zirconium oxide, and hafnium oxide.

An upper electrode UE may be disposed on the second insulating layer 20. The upper electrode UE may overlap the gate G1. The upper electrode UE may be defined by a portion of a metal pattern or a portion of a doped semiconductor pattern. A portion of the gate G1 and the upper electrode UE overlapping the portion of the gate G1 may collectively define a capacitor Cst (refer to FIG. 4). In an alternative embodiment of the invention, the upper electrode UE may be omitted.

Although FIG. 5 illustrates an embodiment where the second insulating layer 20 is disposed in the entire active region AA, the embodiment of the invention is not limited thereto, and alternatively, the second insulating layer 20 may be replaced with an insulating pattern. In such an embodiment, the upper electrode UE is disposed on the insulating pattern. The upper electrode UE may function as a mask which is configured to form an insulating pattern from the second insulating layer 20.

Although not illustrated separately, the first electrode Cst1 and the second electrode Cst2 of the capacitor Cst (refer to FIG. 4) may be formed through a same process as those of the gate G1 and the upper electrode UE. The first electrode Cst1 may be disposed on the first insulating layer 10. The first electrode Cst1 may be electrically connected to the gate G1. The first electrode Cst1 may have an integral shape or be integrally formed with the gate G1 as a single unitary indivisible part.

A third insulating layer 30 may be disposed on the second insulating layer 20 to cover the upper electrode UE. In an embodiment, the third insulating layer 30 may include at least one selected from aluminum oxide, titanium oxide, silicon oxide, silicon nitride, silicon oxynitride, zirconium oxide, and hafnium oxide.

Although not illustrated separately, the sources S2, S5, S6, and S7 and the drains D2, D5, D6, and D7 of the second, fifth, sixth, and seventh transistors T2, T5, T6, and T7 may be formed through a same process as those of the source S1 and drain D1 of the first transistor T1, and the gates G2, G5, G6, and G7 may be formed through a same process as that of the gate G1. Patterns formed through a same process may be disposed in a same layer as each other.

A second semiconductor pattern is disposed on the third insulating layer 30. The second semiconductor pattern may include a metal oxide. An oxide semiconductor may include a crystalline or amorphous oxide semiconductor.

In an embodiment, for example, the oxide semiconductor may include a metal oxide including zinc (Zn), indium (In), gallium (Ga), tin (Sn), titanium (Ti), or the like, or a mixture of a metal such as zinc (Zn), indium (In), gallium (Ga), tin (Sn), or titanium (Ti), and an oxide thereof.

In an embodiment, for example, the oxide semiconductor may include one selected from an indium-tin oxide ("ITO"), an indium-gallium-zinc oxide ("IGZO"), a zinc oxide (ZnO), an indium-zinc oxide ("IZO"), a zinc-indium oxide ("ZIO"), an indium oxide (InO), a titanium oxide (TiO), an indium-zinc-tin oxide ("IZTO"), and a zinc-tin oxide ("ZTO").

In an embodiment, as illustrated in FIG. 5, the source S3, the active A3, and the drain D3 of the third transistor T3 are formed from (or defined by portions of) the second semiconductor pattern. The source S3 and the drain D3 include a metal reduced from a metal oxide semiconductor. The source S3 and the drain D3 may have a predetermined thickness from the upper surface of the second semiconductor pattern and include a metal layer including the reduced metal.

A fourth insulating layer 40 is disposed on the third insulating layer 30 to cover the second semiconductor pattern. In an embodiment, the fourth insulating layer 40 may include a silicon oxide layer and a silicon nitride layer. The fourth insulating layer 40 may include a plurality of silicon oxide layers and silicon nitride layers that are alternately stacked one on another.

The gate G3 of the third transistor T3 is disposed on the fourth insulating layer 40. The gate G3 may be a portion of a metal pattern. The gate G3 of the third transistor T3 overlaps the active A3 of the third transistor T3.

Although FIG. 5 illustrates an embodiment where the fourth insulating layer 40 is disposed in the entire active region AA, the embodiment of the invention is not limited thereto, and alternatively, the fourth insulating layer 40 may be replaced with an insulating pattern. In such an embodiment, the gate G3 of the third transistor T3 is disposed on the insulating pattern. In such an embodiment, the gate G3 may have a same shape as the insulating pattern on a plane.

A fifth insulating layer 50 may be disposed on the fourth insulating layer 40 to cover the gate G3. In an embodiment, the fifth insulating layer 50 may include a silicon oxide layer and a silicon nitride layer. The fifth insulating layer 50 may include a plurality of silicon oxide layers and silicon nitride layers that are alternately stacked one on another.

Although not illustrated separately, the source S4 and the drain D4 of the fourth transistor T4 (refer to FIG. 3) may be formed through a same process as those of the source S3 and the drain D3 of the third transistor T3, and the gate G4 may be formed through a same process as that of the gate G3 of the third transistor T3.

At least one insulating layer is further disposed on the fifth insulating layer 50. In an embodiment, a sixth insulating layer 60 and a seventh insulating layer 70 may be disposed on the fifth insulating layer 50. The sixth insulating layer 60 and the seventh insulating layer 70 may be organic layers and have a single-layered or multi-layered structure. The sixth insulating layer 60 and the seventh insulating layer 70 may be a single polyimide-based resin layer.

In an embodiment, each of the sixth insulating layer 60 and the seventh insulating layer 70 may include at least one selected from an acrylic-based resin, a methacrylic-based resin, a polyisoprene, a vinyl-based resin, an epoxy-based resin, a urethane-based resin, a cellulose-based resin, a siloxane-based resin, a polyarnide-based resin, and a perylene-based resin, but not being limited thereto.

A first connection electrode CNE1 may be disposed on the fifth insulating layer 50. The first connection electrode CNE1 may be connected to the connection signal line SCL through a first contact hole CHI defined through the first to fifth insulating layers 10 to 50.

A second connection electrode CNE2 may be disposed on the sixth insulating layer 60. The second connection electrode CNE2 is connected to the first connection electrode CNE1 through a second contact hole CH-60 defined through the sixth insulating layer 60.

The seventh insulating layer 70 may be disposed on the sixth insulating layer 60 to cover the second connection electrode CNE2.

The components of a light emitting diode OLED may be disposed on the seventh insulating layer 70. The first electrode AE of the light emitting diode OLED is disposed on the seventh insulating layer 70. A pixel defining layer PDL is disposed on the seventh insulating layer 70. An opening OP exposing at least a portion of the first electrode AE may be defined in the pixel defining layer PDL. In an embodiment, the pixel defining layer PDL may have a predetermined color and include a light absorbing material. In an embodiment, for example, the pixel defining layer PDL may have a black color.

The first to seventh transistors T1 to T7 (refer to FIG. 4) connected to the light-emitting diode OLED may constitute one pixel PXij (refer to FIG. 4).

The opening OP of the pixel defining layer PDL may define the light-emitting region PXA. In an embodiment, for example, a plurality of pixels PXij (refer to FIG. 3) may be arranged on the plane of the display panel DP according to a specific rule. The region in which the plurality of pixels PXij are disposed may be defined as an active region AA (refer to FIG. 1A), and the active region AA may include a plurality of light-emitting regions and a non-light-emitting region NPXA adjacent to the light-emitting regions. The non-light-emitting region NPXA may surround the light-emitting region PXA.

The first electrode AE is disposed on the seventh insulating layer 70. The first electrode AE is connected to the second connection electrode CNE2 through a third contact hole CH-70 defined through the seventh insulating layer 70.

A hole control layer HCL may be commonly disposed in the light-emitting region PXA and the non-light-emitting region NPXA. A common layer such as the hole control layer HCL may be commonly provided or formed in a plurality of pixels PXij. The hole control layer HCL may include a hole transport layer and a hole injection layer.

An light-emitting layer EML is disposed on the hole control layer HCL. The light-emitting layer EML may overlap the opening OP. The light-emitting layer EML may be provided or formed separately in each of the plurality of pixels PXij.

In an embodiment, as shown in FIG. 5, the light-emitting layer EML may be a patterned light-emitting layer, but not being limited thereto. Alternatively, the light-emitting layer EML may be commonly disposed in the plurality of pixels PXij. In such an embodiment, the light-emitting layer EML may generate white light or blue light. In such an embodiment, the light-emitting layer EML may have a multi-layered structure.

An electron control layer ECL is disposed on the light-emitting layer EML. The electron control layer ECL may include an electron transport layer and an electron injection layer. A second electrode CE is disposed on the electron control layer ECL. The electron control layer ECL and the second electrode CE are commonly disposed in the plurality of pixels PXij.

A thin film encapsulation layer 80 (corresponding to the encapsulation layer TFE of FIG. 2) is disposed on the second electrode CE. The thin film encapsulation layer 80 is commonly disposed in the plurality of pixels PXij. In an embodiment, the thin film encapsulation layer 80 directly covers the second electrode CE. The thin film encapsulation layer 80 may include a first inorganic layer 81, an organic layer 82, and a second inorganic layer 83. However, the embodiment of the invention is not limited thereto, and the thin film encapsulation layer 80 may further include a plurality of inorganic layers and organic layers.

The first inorganic layer 81 may come in contact with the second electrode CE. The first inorganic layer 81 may prevent external moisture or oxygen from penetrating into the light-emitting layer EML. In an embodiment, for example, the first inorganic layer 81 may include silicon nitride, silicon oxide, or a combination thereof. The first inorganic layer 81 may be formed through a deposition process.

The organic layer 82 may be disposed on the first inorganic layer 81 to come in contact with the first inorganic layer 81. The organic layer 82 may provide a flat surface above the first inorganic layer 81. Since curves formed on the upper surface of the first inorganic layer 81, particles existing on the first inorganic layer 81, and the like are covered by the organic layer 82, the organic layer 82 may block the surface state of the upper surface of the first inorganic layer 81 from influencing components formed on the organic layer 82. The organic layer 82 may include an organic material and be formed through a solution process such as a spin coating process, a slit coating process, or an inkjet process.

The second inorganic layer 83 is disposed on the organic layer 82 to cover the organic layer 82. The second inorganic layer 83 may be more stably formed on a relatively flat surface than on the first inorganic layer 81. The second inorganic layer 83 prevents moisture or oxygen from being introduced into the light-emitting layer EML. The second inorganic layer 83 may include silicon nitride, silicon oxide, or a combination thereof. The second inorganic layer 83 may be formed through a deposition process.

An input sensing layer 90 (corresponding to the input sensing layer ISL of FIG. 2) may be disposed or formed directly on the thin film encapsulation layer 80. The input sensing layer 90 may include a plurality of conductive patterns MS1 and MS2 and sensing insulating layers. The sensing insulating layers may include a first sensing insulating layer 91, a second sensing insulating layer 92, and a third sensing insulating layer 93.

The first sensing insulating layer 91 is disposed on the thin film encapsulation layer 80. First conductive patterns MS1 may be disposed on the first sensing insulating layer 91 and covered by the second sensing insulating layer 92. Second conductive patterns MS2 may be disposed on the second sensing insulating layer 92 and covered by the third sensing insulating layer 93.

Each of the conductive patterns MS1 and MS2 has conductivity. Each of the conductive patterns MS1 and MS2 may be provided as a single layer or a plurality of layers, but the invention is not limited to any one embodiment. In an embodiment, at least one selected from the conductive patterns MS1 and MS2 may be provided as mesh lines on a plane.

In such an embodiment, the mesh lines constituting the conductive patterns MS1 and MS2 may be spaced apart from the light-emitting layer EML on a plane. Accordingly, in such an embodiment where the input sensing layer 90 is formed directly on the display panel DP, light formed in the pixels PXij (refer to FIG. 4) of the display panel DP may be provided to a user without interference of the input sensing layer 90.

The filter layer CFL may include a color filter 100, a black matrix BM, and an overcoat layer OC.

The color filter 100 may include a polymer photosensitive resin and a pigment or dye. In an embodiment, for example, the color filter 100 overlapping the light-emitting layer EML configured to provide blue light may include a blue pigment or dye, the color filter 100 overlapping the light-emitting layer EML configured to provide green light may include a green pigment or dye, and the color filter 100 overlapping the light-emitting layer EML configured to provide red light may include a red pigment or dye.

However, the embodiment of the invention not limited thereto, and alternatively, the color filter 100 overlapping the light-emitting layer EML configured to provide blue light may not include a pigment or dye. In such an embodiment, the color filter 100 may be transparent, and the color filter 100 may include or be formed of a transparent photosensitive resin.

The black matrix BM may be disposed between color filters which provide different light. The black matrix BM may be a pattern having a black color and may be a grid-shaped matrix. The black matrix BM may include a black coloring agent. The black coloring agent may include a black dye and a black pigment. The black coloring agent may include carbon black, a metal such as chromium, or an oxide thereof.

The overcoat layer OC may be disposed on the color filter 100 and the black matrix BM. The overcoat layer OC may cover the unevenness generated during the formation of the color filter 100 and the black matrix BM and provide a flat surface. That is, the overcoat layer OC may be a planarization layer. The window WM described in FIG. 2 may be coupled to the overcoat layer OC by an adhesive layer AL.

Figure 6:
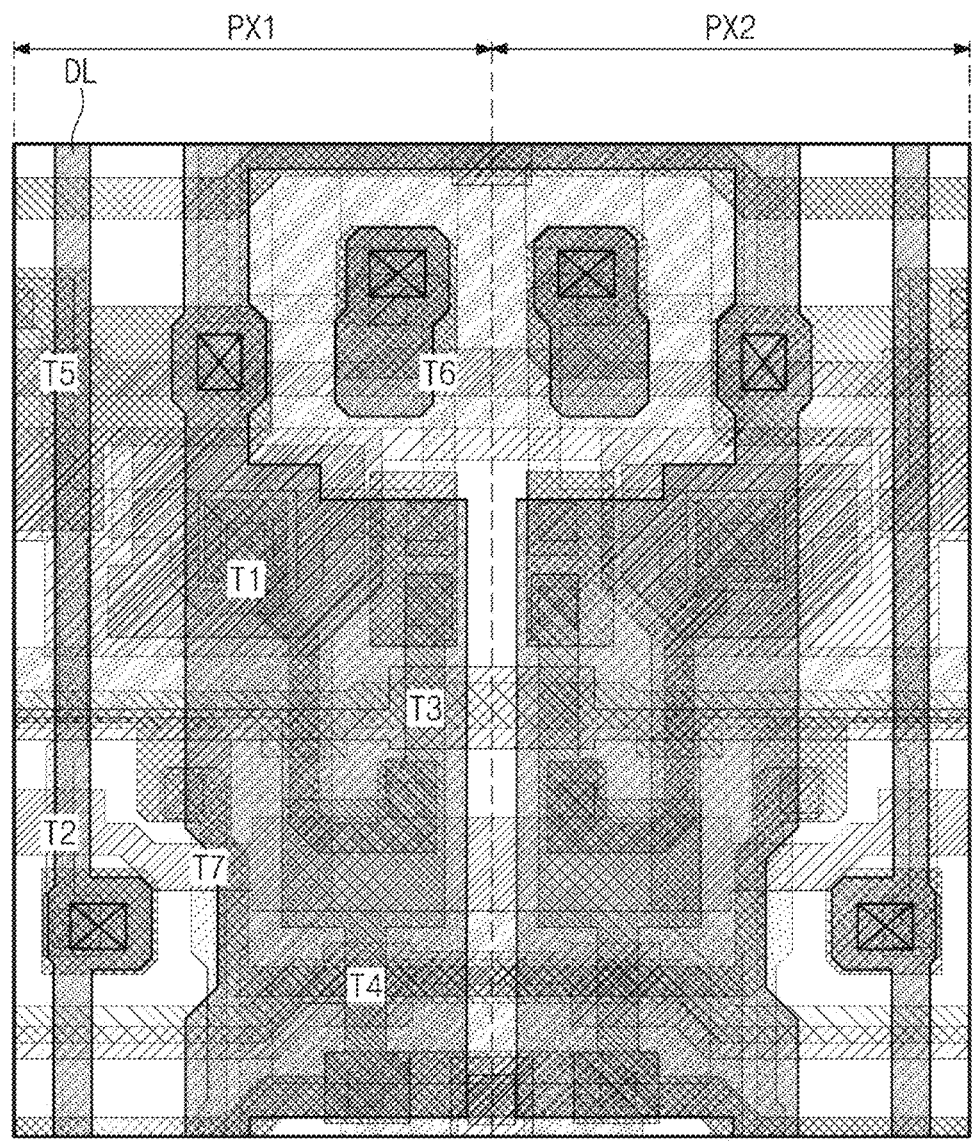
FIG. 6 is a plan view of adjacent pixels according to an embodiment of the invention.

FIG. 6 is a plan view of adjacent pixels according to an embodiment of the invention. FIGS. 7A to 7H are plan views according to a stacking order of patterns included in adjacent pixels according to an embodiment of the invention. Hereinafter, a detailed description of the same configuration as that described with reference to FIGS. TA to 5 will be omitted.

FIG. 6 is a plan view of adjacent pixels PX1 and PX2. Each of the pixels PXT and PX2 may have the equivalent circuit of FIG. 4. Accordingly, each of the pixels PX1 and PX2 may include the first to seventh transistors T1 to T7. Each of the conductive patterns and the semiconductor patterns included in each of the pixels PX1 and PX2 may have a structure of being repeatedly arranged according to a predetermined rule.

Hereinafter, reference numerals for the same components among the components disposed in each of the pixels PX1 and PX2 will be omitted for the convenience of description.

The plan views of the pixels PX1 and PX2 illustrated in FIGS. 7A to 7H will be described together with the equivalent circuit diagram of FIG. 4 and the cross-sectional view of the display module DM illustrated in FIG. 5.

Figure 7A:
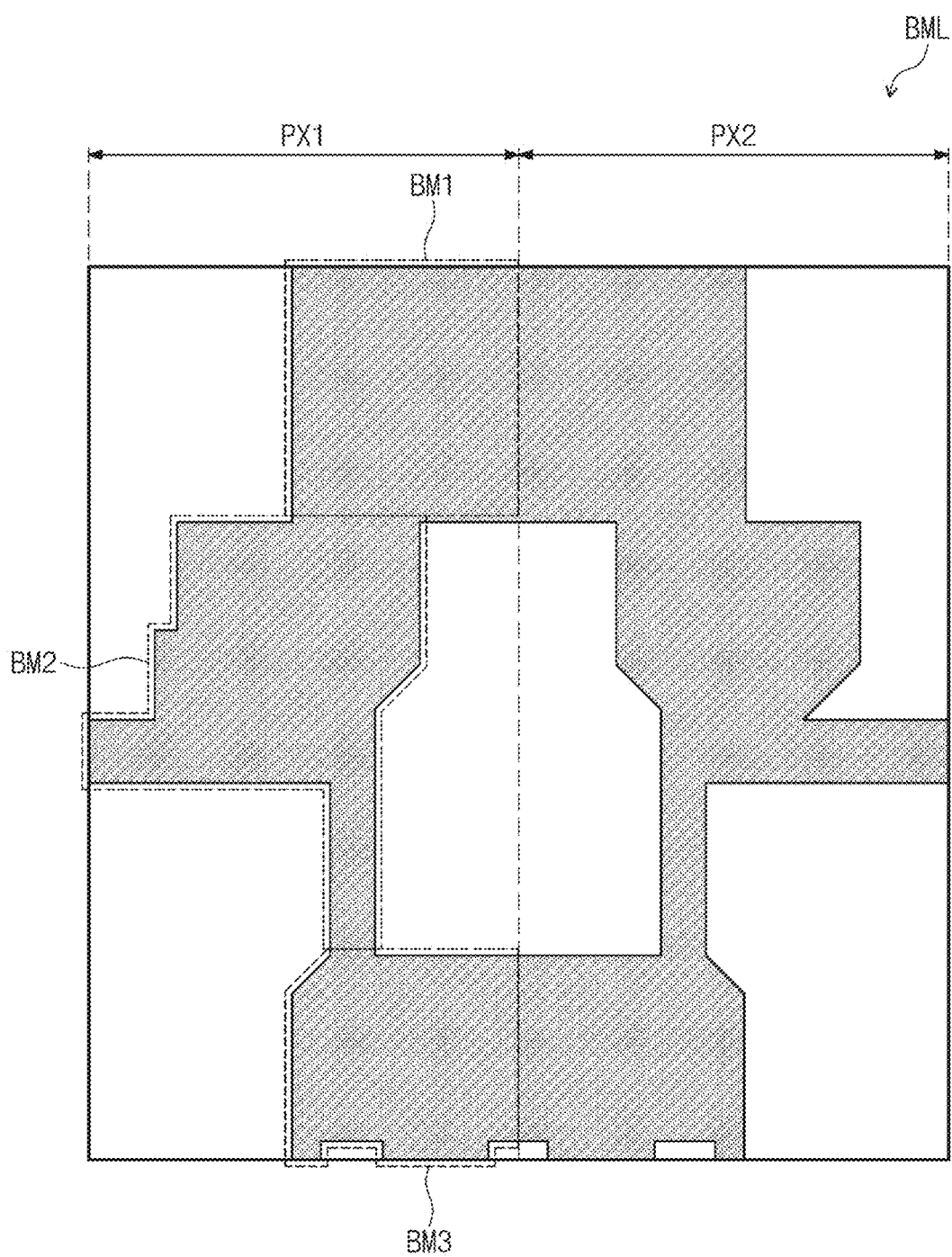
FIGS. 7A to 7H are plan views according to a stacking order of patterns included in adjacent pixels according to an embodiment of the invention.

Referring to FIGS. 7A and 5, the reinforcing layer BML may be disposed between the barrier layer BI and the buffer layer BFL. The reinforcing layer BML may include a metal. In an embodiment, for example, the reinforcing layer BML may include molybdenum.

In an embodiment, the reinforcing layer BML may include first to third patterns BM1, BM2, and BM3. The first and second patterns BM1 and BM2 may overlap the active of a P-type transistor among the first to seventh transistors T1 to T7, and the third pattern BM3 may overlap the active of an N-type transistor among the first to seventh transistors T1 to T7.

The first to third patterns BM1, BM2, and BM3 are portions of a single unit or integrally formed with each other as a single unitary indivisible part, but the patterns are divided or defined for the convenience of describing an arrangement relationship with the actives included in the first to seventh transistors T1 to T7.

In such an embodiment, as the reinforcing layer BML is disposed below the semiconductor pattern included in each of the first to seventh transistors T1 to T7, the reinforcing layer BML may function to block light incident from the outside. In such an embodiment, the reinforcing layer BML may block an electric potential due to polarization between insulating layers disposed on the reinforcing layer BML from affecting the semiconductor patterns included in the first to seventh transistors T1 to T7.

In an embodiment, the reinforcing layer BML may be disposed in a region vulnerable to an external impact among the first to seventh transistors T1 to T7 to improve the durability of the display panel DP. In an embodiment, for example, when a neutral plane on which stress is not applied is formed in the input sensing layer ISL (refer to FIG. 2) during an impact applied to the display module DM, as the neutral plane is placed at a lower position, the reinforcing layer BML may reduce the tensile stress which is applied to the conductive layers disposed between the input sensing layer ISL and the reinforcing layer BML. Accordingly, in such an embodiment where the display device DD include the reinforcing layer BML, the display device DD may have improved durability. The overlapping relationship between the semiconductor pattern included in the first to seventh transistors T1 to T7 and the reinforcing layer BML will be described later.

Referring to FIGS. 7B, 7C, 4, and 5, a first semiconductor pattern SCP1 may be disposed between the buffer layer BFL and the first insulating layer 10. The first semiconductor pattern SCP1 may include a plurality of regions having different doping concentrations from each other.

Figure 7B:
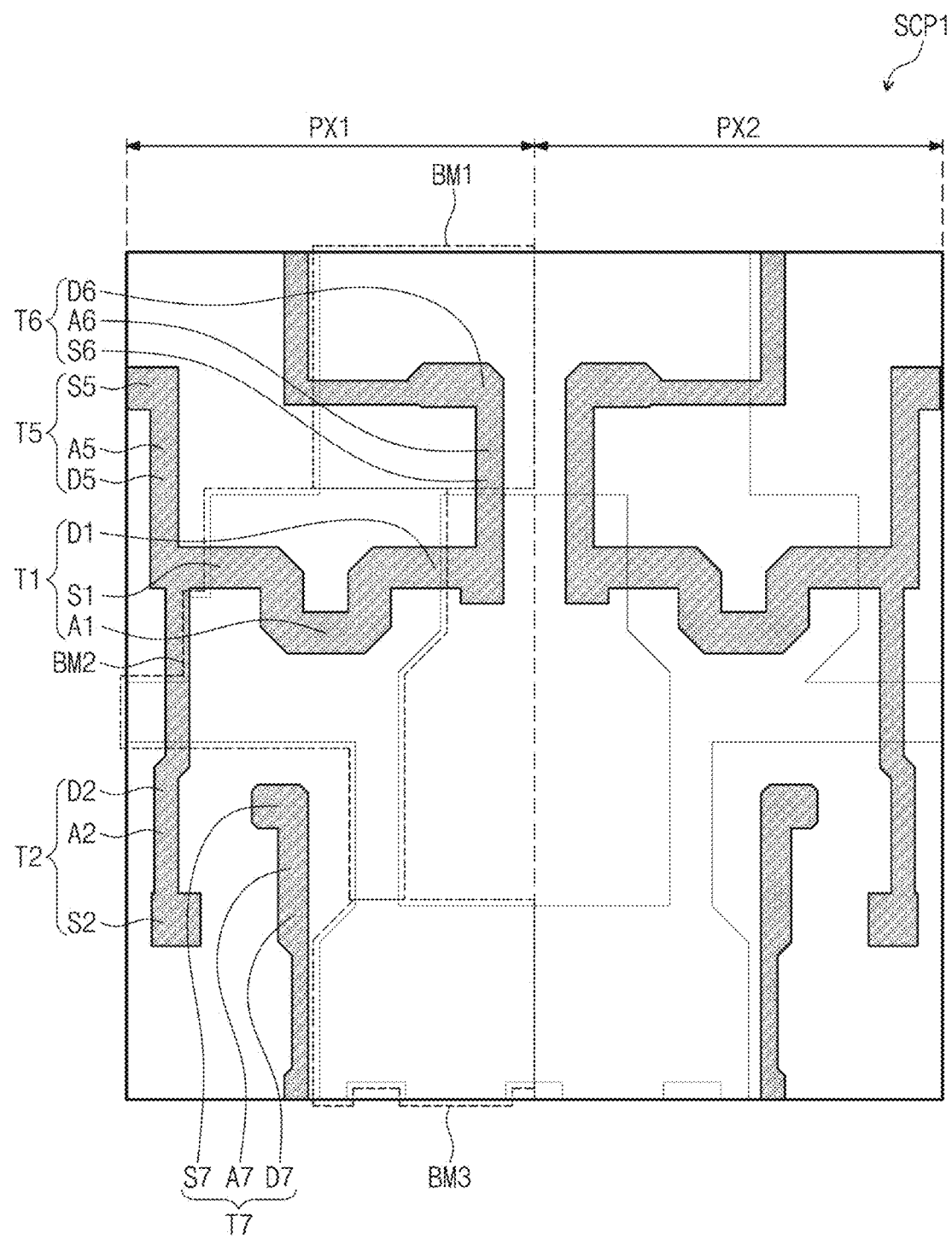

Referring to FIG. 7B, the first semiconductor pattern SCP1 may include a semiconductor pattern of each of the first, second, fifth, sixth, and seventh transistors T1, T2, T5, T6, and T7. Each semiconductor pattern may include a source S1, S2, S5, S6, or S7, an active A1, A2, A5, A6, or A7, and a drain D1, D2, D5, D, or D7. The active A1, A2, A5, A6, or A7 may be defined as a region overlapping a first metal pattern MP1 to be described later.

I an embodiment, the first semiconductor pattern SCP1 may include a silicon semiconductor. In an embodiment, for example, the silicon semiconductor may include amorphous silicon, polycrystalline silicon, and the like. In an embodiment, for example, the first semiconductor pattern SCP1 may include low-temperature polycrystalline silicon ("LTPS").

According to an embodiment of the invention, the first, second, fifth, sixth, and seventh transistors T1, T2, T5, T6, and T7 included in the first semiconductor pattern SCP1 may be P-type transistors, and the third and fourth transistors T3 and T4 may be N-type transistors.

In such an embodiment, the first transistor T1, which directly affects the brightness of the display device DD, is configured to include a semiconductor pattern including or made of polycrystalline silicon having high reliability, such that a high-resolution display device DD may be achieved.

The connection signal line SCL described in FIG. 5 may be defined as a portion of a pattern extending between the first, second, fifth, sixth, and seventh transistors T1, T2, T5, T6, and T7.

Figure 7C:
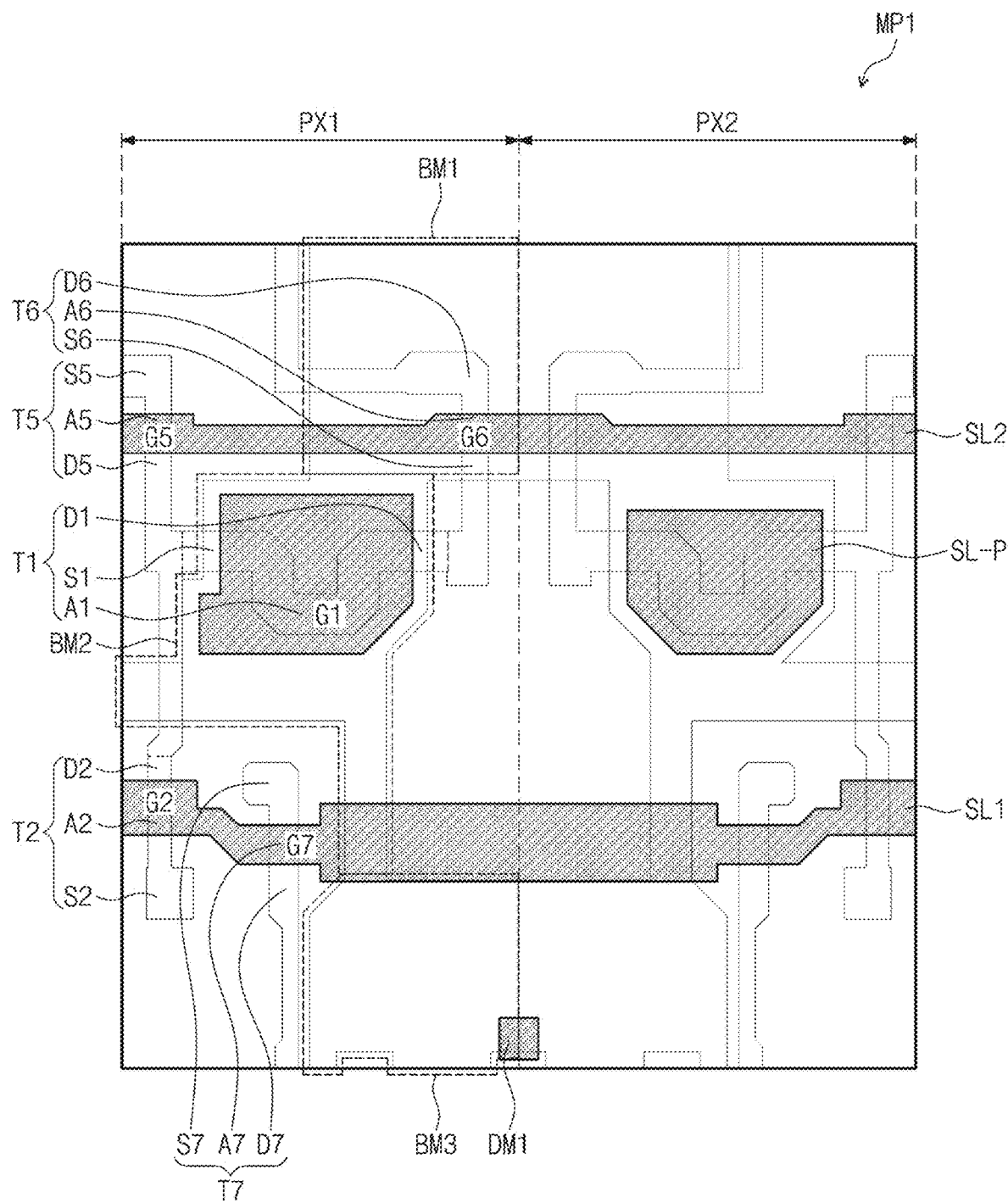

Referring to FIG. 7C, the first metal pattern MP1 is disposed between the first insulating layer 10 and the second insulating layer 20. The first metal pattern MP1 may include a first scan line SL1, a second scan line SL2, and a gate pattern SL-P. A doping process of the first semiconductor pattern SCP1 may be performed by using the first metal pattern MP1 as a mask. Accordingly, a portion of the first semiconductor pattern SCP1 that overlaps the first metal pattern MP1 may be defined as an active A1, A2, A5, A6, or A7.

A portion of the first scan line SL1 that overlaps the active A2 of the second transistor T2 may be the gate G2, and a portion of the first scan line SL1 that overlaps the active A7 of the seventh transistor T7 may be the gate G7. The first semiconductor pattern SCP1 overlapping the gate pattern SL-P may be the gate G1. A portion of the second scan line SL2 that overlaps the active A5 of the fifth transistor T5 may be a gate G5, and a portion of the second scan line SL2 that overlaps the active A6 of the sixth transistor T6 may be the gate G6.

In an embodiment, the first metal pattern MP1 may include a first dummy pattern DM1. The first dummy pattern DM1 may be in a floating state with the first metal pattern MP1.

Figure 7D:
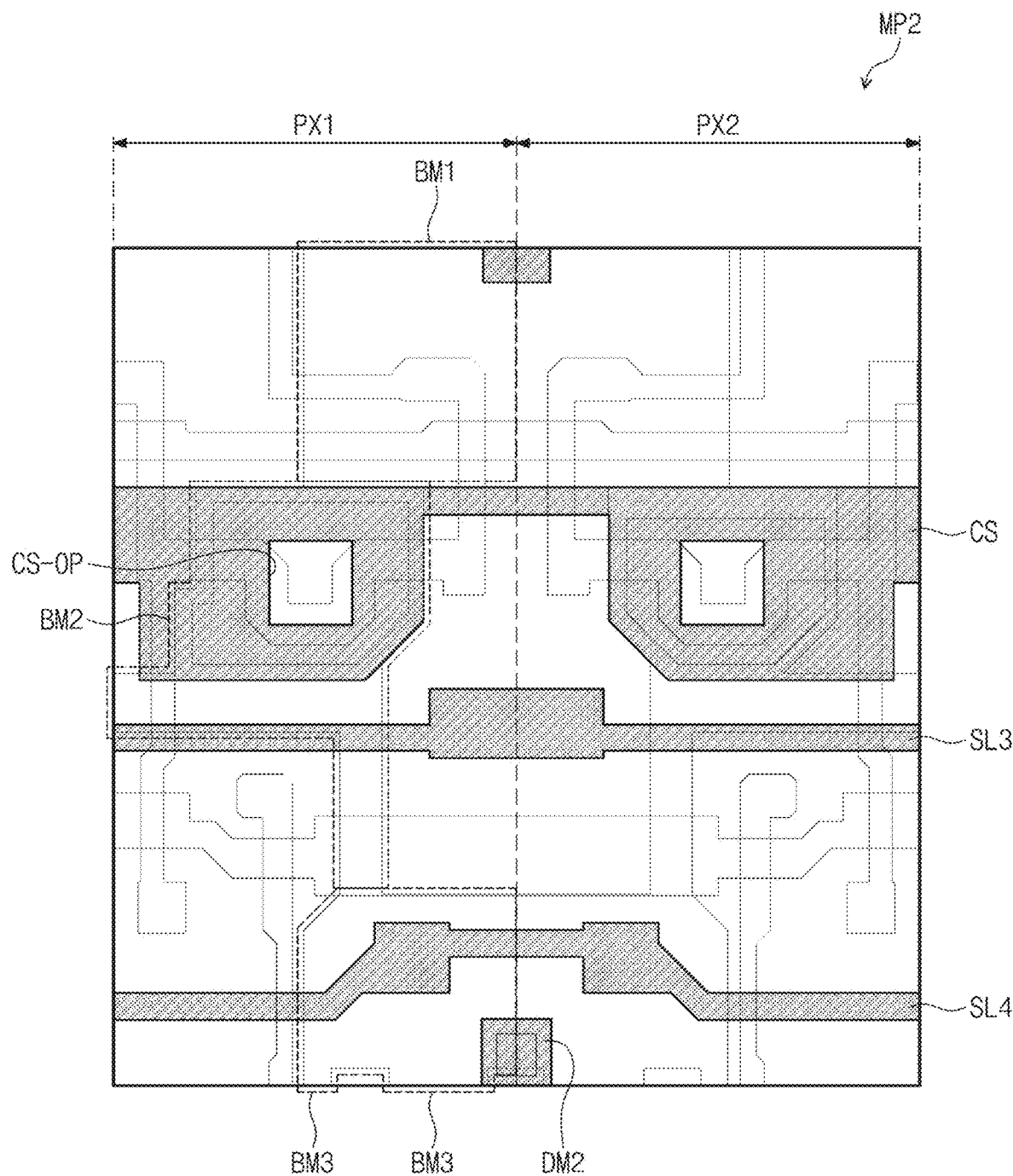

Referring to FIGS. 7D, 4, and 5, a second metal pattern MP2 is disposed between the second insulating layer 20 and the third insulating layer 30. The second metal pattern MP2 may include a first compensation pattern SL3, a second compensation pattern SL4, and an upper electrode pattern CS.

A portion of the upper electrode pattern CS of the second metal pattern MP2 that overlaps the gate G1 may be the upper electrode UE described with reference to FIG. 5. The remaining portion of the upper electrode pattern CS may define a capacitor Cst together with the gate G1 of the first transistor T1.

The upper electrode pattern CS may have an electrode opening CS-OP defined through the upper electrode pattern CS, and the gate pattern SL-P may be exposed through the electrode opening CS-OP.

In an embodiment, the first compensation pattern SL3 and the second compensation pattern SL4 overlap a third scan line SL5 and a fourth scan line SL6 to be described later and are connected through a contact hole to the third scan line SL5 and the fourth scan line SL6, so that the resistance of the third scan line SL5 and the fourth scan line SL6 may be reduced. In such an embodiment, the first compensation pattern SL3 and the second compensation pattern SL4 may serve to block light incident to the third scan line SL5 and the fourth scan line SL6.

In an embodiment, the second metal pattern MP2 may further include a second dummy pattern DM2. The second dummy pattern DM2 may overlap the first dummy pattern DM1.

Figure 7E:
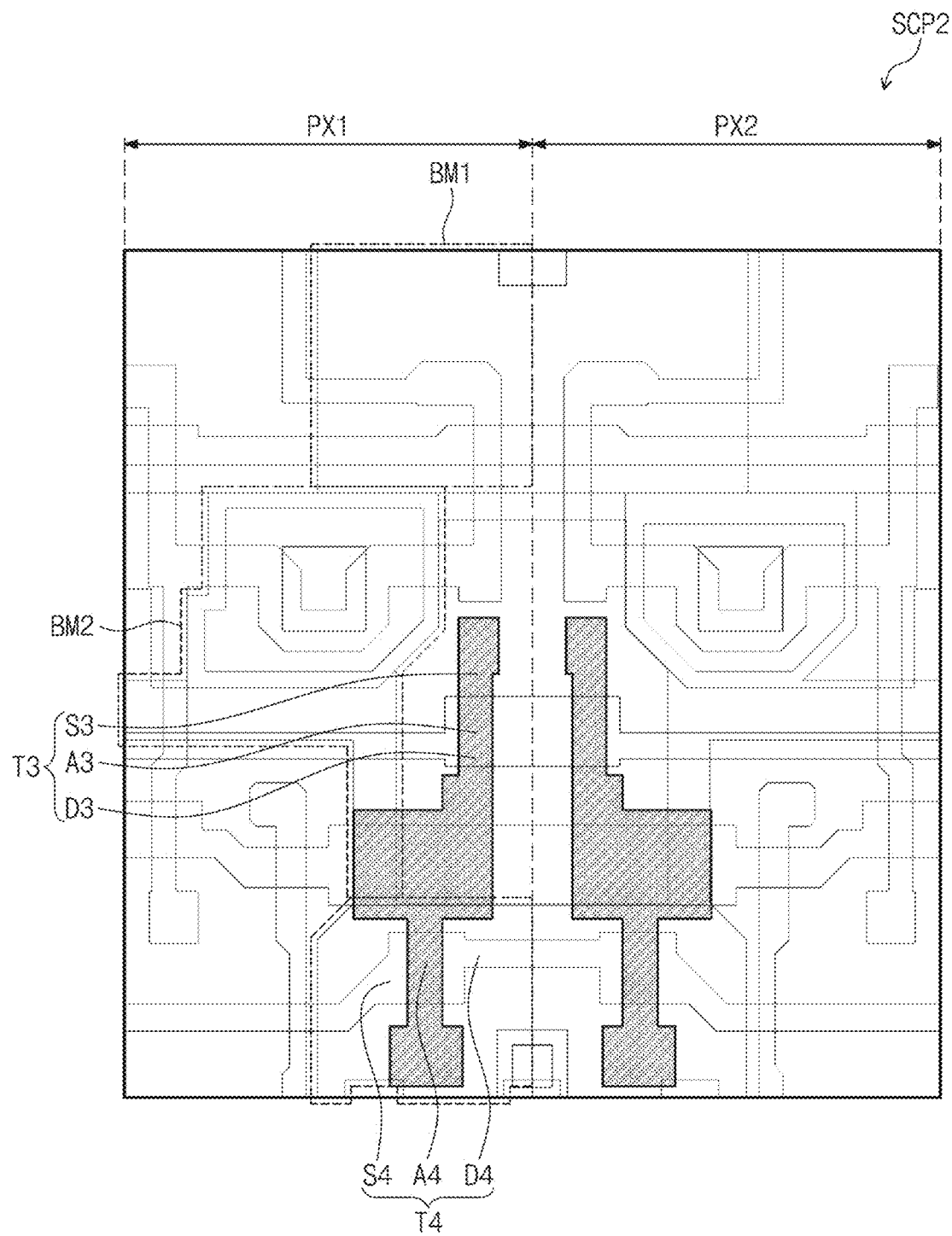

Referring to FIGS. 7E, 4, and 5, a second semiconductor pattern SCP2 may be disposed between the third insulating layer 30 and the fourth insulating layer 40. The second semiconductor pattern SCP2 may include a plurality of regions divided according to whether or not a metal oxide is reduced.

The second semiconductor pattern SCP2 may include a semiconductor pattern of each of the third and fourth transistors T3 and T4. Each semiconductor pattern may include a source S3 or S4, an active A3 or A4, and a drain D3 or D4. The active A3 or A4 may be defined as a region overlapping a third metal pattern MP3 to be described later. The active A4 of the fourth transistor T4 extends from the active A3 of the third transistor T3.

A region other than the third and fourth transistors T3 and T4 of the second semiconductor pattern SCP2 may be defined as a connection signal line. One connection signal line extends from the source S3 of the third transistor T3 and/or the drain D4 of the fourth transistor T4. The connection signal line is connected to the gate G1 of the first transistor T1 through a contact hole defined in the third insulating layer 30.

The drain D3 of the third transistor T3 is connected to the source S6 of the sixth transistor T6 through a contact hole defined in the third insulating layer 30.

Figure 7F:
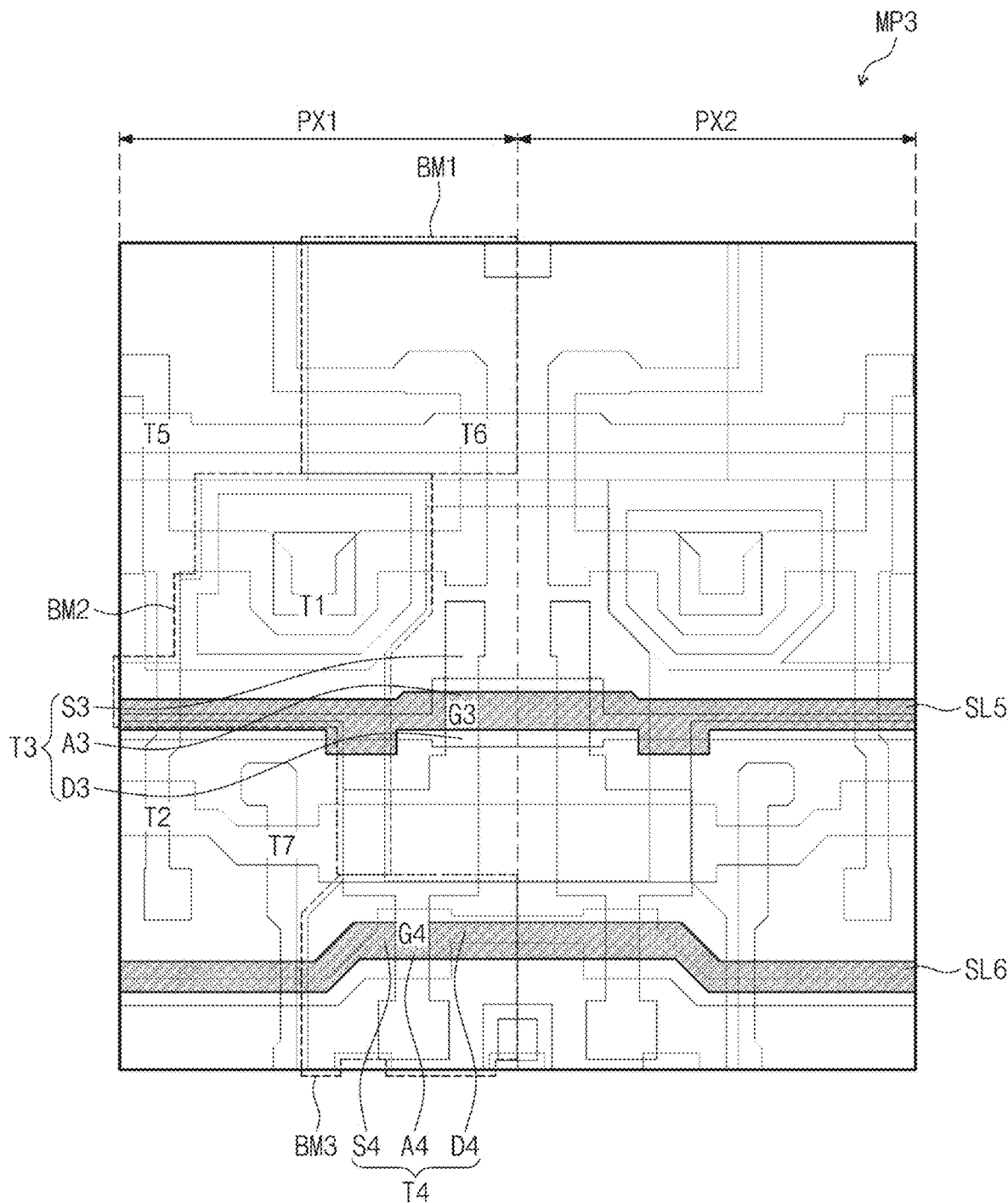

Referring to FIG. 7F, the third metal pattern MP3 is disposed between the fourth insulating layer 40 and the fifth insulating layer 50. The third metal pattern MP3 may include the third scan line SL5 and the fourth scan line SL6.

A doping process of the second semiconductor pattern SCP2 may be performed by using the second metal pattern MP2 as a mask. Accordingly, a portion of the second semiconductor pattern SCP2 that overlaps the second metal pattern MP2 may be defined as an active A3 or A4.

A portion of the third scan line SL5 that overlaps the active A3 of the third transistor T3 may be the gate G3, and a portion of the fourth scan line SL6 that overlaps the active A4 of the fourth transistor T4 may be the gate G4. The third scan line SL5 may correspond to the i-th scan line GLi of the second group of FIG. 4, and the fourth scan line SL6 may correspond to the i-th scan line HLi of the third group.

In an embodiment, the second semiconductor pattern SCP2 may include an oxide semiconductor. The third and fourth transistors T3 and T4 may be N-type transistors. Since an oxide semiconductor pattern has a high carrier mobility and a low leakage current, a voltage drop is not large although a driving time is long. That is, since a color change of an image according to the voltage drop is not large even during low-frequency driving, the low-frequency driving may be effectively performed.

In an embodiment, as described above, since the oxide semiconductor pattern has a desired characteristic with small leakage current, at least one of the third transistor T3 or the fourth transistor T4 which are connected to the driving gate electrode of the first transistor T1 may be defined by an oxide semiconductor pattern to prevent leakage current from flowing to the driving gate electrode and reduce power consumption as well.

Referring back to FIG. 7A, in an embodiment, the reinforcing layer BML may overlap at least one selected from the actives A1, A2, A3, A4, A5, A6, and A7 of the first to seventh transistors T1 to T7.

In an embodiment, for example, the reinforcing layer BML may overlap three or more actives among the actives A1, A2, A3, A4, A5, A6, and A7 of the first to seventh transistors T1 to T7.

In an embodiment, the first pattern BM1 may overlap the active A6 of the sixth transistor T6, the second pattern BM2 may overlap the active A1 of the first transistor T1, and the third pattern BM3 may overlap the active A4 of the fourth transistor T4. The first pattern BM1 and the second pattern BM2 may overlap the actives A6 and A1 included in the P-type transistor, and the third pattern BM3 may overlap the active A4 included in the N-type transistor. In such an embodiment, the reinforcing layer BML may overlap the three actives A6, A1, and A4.

Accordingly, in such an embodiment, the distances from the reinforcing layer BML to the first and second semiconductor patterns SCP1 and SCP2 may be different from each other. In an embodiment, for example, the distance from the reinforcing layer BML to the active A1 and the active A6 of the first semiconductor pattern SCP1 is shorter than the distance from the reinforcing layer BML to the active A4 of the second semiconductor pattern SCP2.

According to an embodiment of the invention, when a neutral plane on which stress is not applied is formed in the input sensing layer ISL during an impact applied to the display module DM, as the neutral plane is placed at a lower position, the reinforcing layer BML may reduce the tensile stress which is applied to the conductive layers disposed between the input sensing layer ISL and the reinforcing layer. In such an embodiment, since the reinforcement layer BML is disposed to overlap each of the actives included in the P-type transistor and the N-type transistor, the display device DD may have improved durability.

Figure 7G:
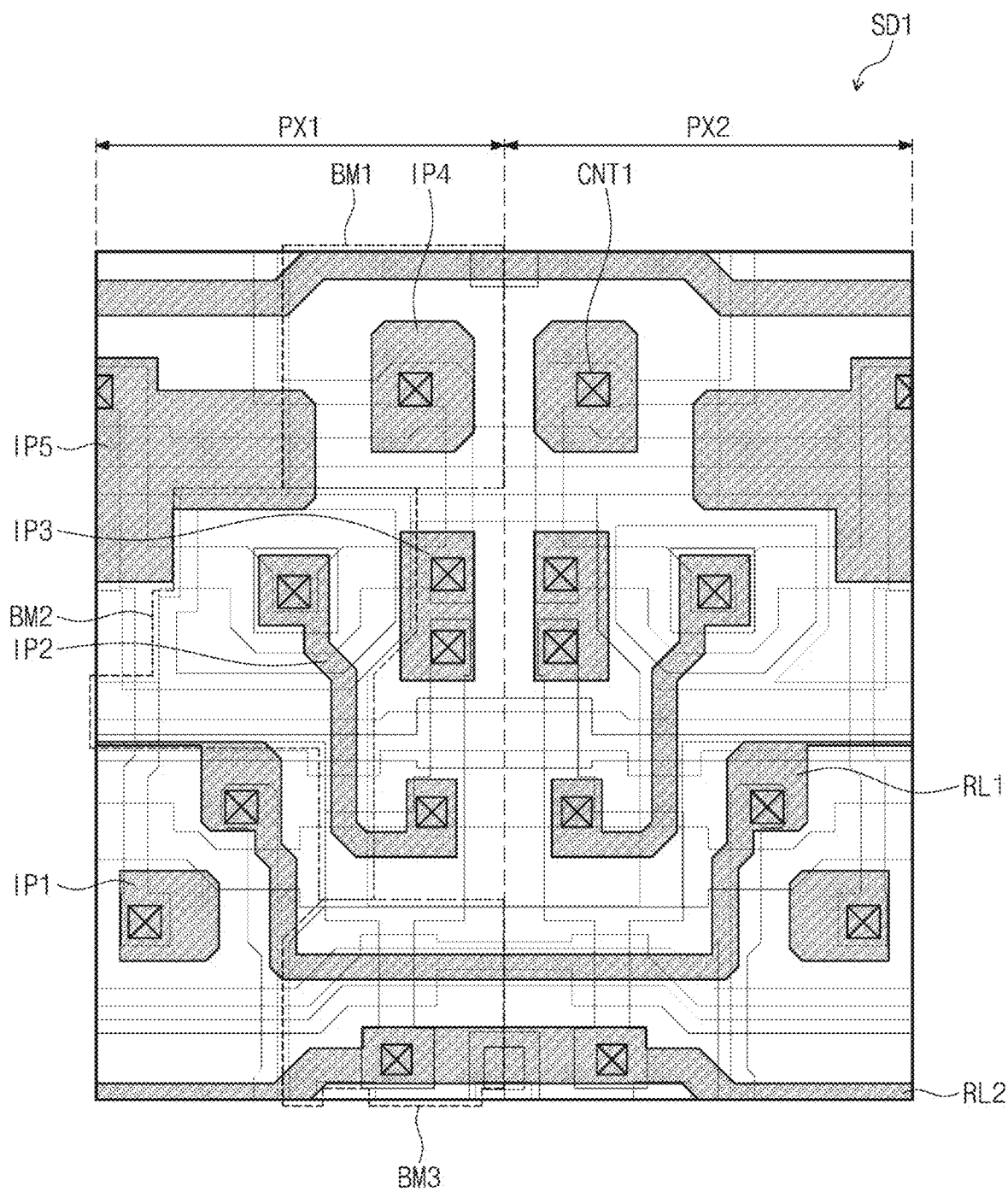

Referring to FIG. 7G, a fourth metal pattern SD1 is disposed between the fifth insulating layer 50 and the sixth insulating layer 60. The fourth metal pattern SD1 may include the third scan line SL5 and the fourth scan line SL6.

The fourth metal pattern SD1 may include a first voltage line RL1, a second voltage line RL2, a first transmission pattern IP1, a second transmission pattern IP2, a third transmission pattern IP3, a fourth transmission pattern IP4, and the fifth transmission pattern IP5. The fourth metal pattern SD1 may include a plurality of first contact holes CNT1 defined through the fourth metal pattern SD1.

The first voltage line RL1 and the second voltage line RL2 may receive a same signal. In an embodiment, for example, each of the first voltage line RL1 and the second voltage line RL2 may correspond to the second voltage line RL described with reference to FIG. 4 and receive an initialization voltage Vint.

However, the embodiment of the invention is not limited thereto, and the first voltage line RL1 and the second voltage line RL2 may receive initialization voltages having different levels from each other.

The first transmission pattern IP1 may come in contact with the first semiconductor pattern SCP1 through a first contact hole CNT1. A data line DL, which will be described later, may transmit a data signal to the first semiconductor pattern SCP1 through the first transmission pattern IP1.

The second transmission pattern IP2 may be connected to the gate pattern SL-P and the second semiconductor pattern SCP2 through first contact holes CNT1 formed on one side and the other side thereof, respectively.

The third transmission pattern IP3 may be connected to the first semiconductor pattern SCP1 and the second semiconductor pattern SCP2 through first contact holes CNT1 defined through portions at opposing sides thereof, respectively.

The fourth transmission pattern IP4 may be connected to the first semiconductor pattern SCP1 through a first contact hole CNT1. The fourth transmission pattern IP4 may transmit a driving current or an initialization voltage Vint from the first semiconductor pattern SCP1 to the light-emitting diode OLED.

The fifth transmission pattern IP5 may come in contact with the first semiconductor pattern SCP1 and the upper electrode pattern CS through first contact holes CNT1 defined through portions at opposing sides thereof, respectively. The first power voltage ELVDD may be transmitted to the first semiconductor pattern SCP1 through the fifth transmission pattern IP5.

Figure 7H:
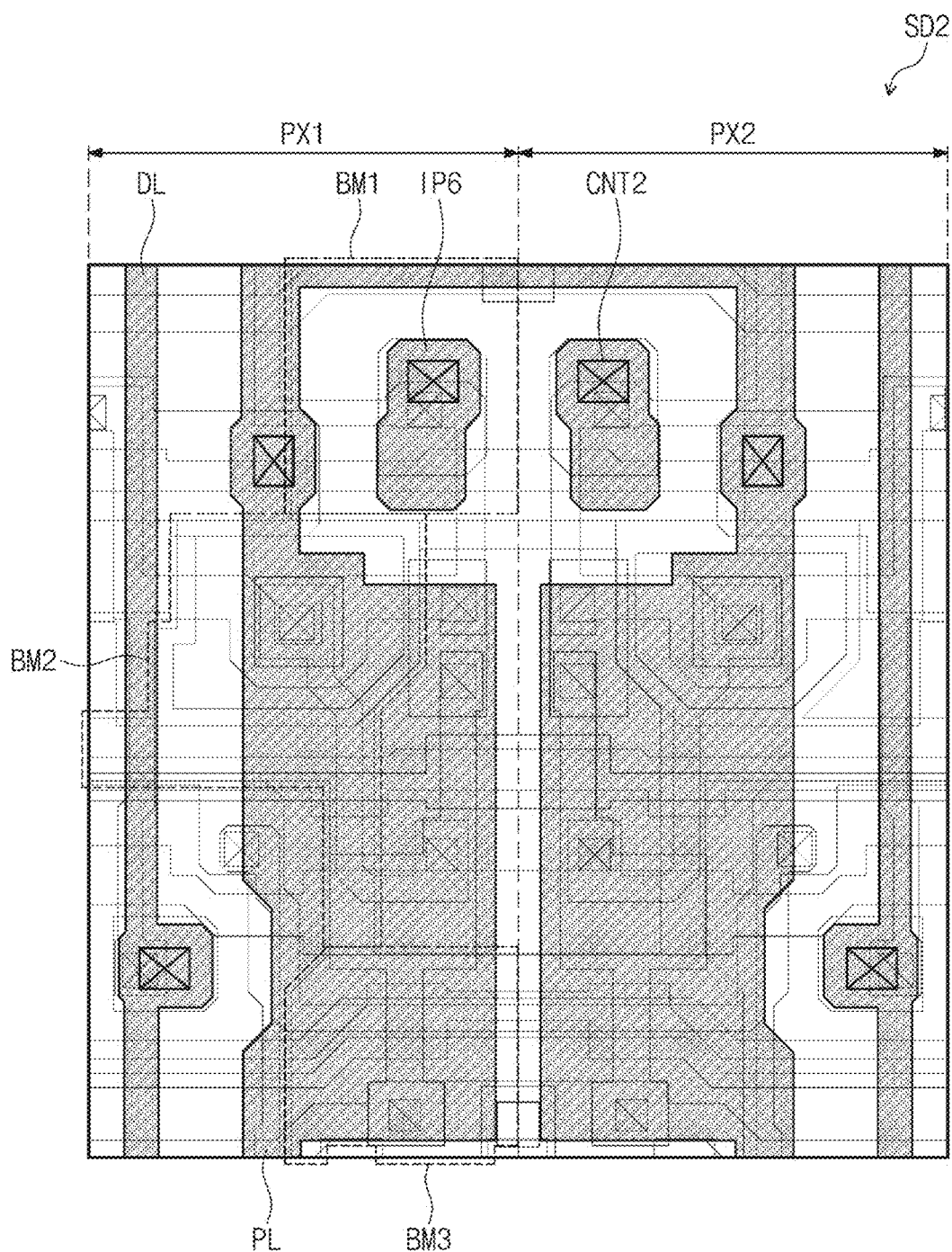

Referring to FIG. 7H, a fifth metal pattern SD2 is disposed between the sixth insulating layer 60 and the seventh insulating layer 70. The fifth metal pattern SD2 may include a data line DL, a voltage line PL, and a sixth transmission pattern IP6. The fifth metal pattern SD2 may include a plurality of second contact holes CNT2 defined through the fifth metal pattern SD2.

The data line DL may correspond to the j-th data line DLj of FIG. 4, and the voltage line PL may correspond to the first voltage line PL.

The sixth transmission pattern IP6 may be connected to the fourth transmission pattern IP4 through a second contact hole CNT2, and the first electrode AE of the light-emitting diode OLED may be connected to the first semiconductor pattern SCP1 through the sixth transmission pattern IP6. The voltage line PL may be connected to the fifth transmission pattern IP5 through a second contact hole CNT2. The data line DL may be connected to the first transmission pattern IP1 through a second contact hole CNT2.

According to embodiments of the invention, when a neutral plane on which stress is not applied is formed in the input sensing layer ISL during an impact applied to the display module DM, as the neutral plane is placed at a lower position, the reinforcing layer BML may reduce the tensile stress which is applied to the conductive layers disposed between the input sensing layer ISL and the reinforcing layer.

In such embodiments, since the reinforcement layer BML is disposed to overlap each of the actives included in the P-type transistor and the N-type transistor, the display device DD having improved durability may be provided.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
   a base layer;
   a circuit layer comprising a reinforcing layer disposed on the base layer and transistors disposed on the reinforcing layer, wherein each of the transistors comprises a semiconductor pattern comprising a source, an active, a drain, and a gate; and
   a display layer comprising a light-emitting diode connected to the transistors,
   wherein:
   some of the semiconductor patterns of the transistors comprise polysilicon;
   others of the semiconductor patterns of the transistors comprise oxide;
   the reinforcing layer overlaps three or more actives among actives of the transistors; and
   a distance from the reinforcing layer to a semiconductor pattern comprising the polysilicon is shorter than a distance from the reinforcing layer to a semiconductor pattern comprising the oxide.

2. The display device of claim 1, wherein the circuit layer comprises:
   a barrier layer disposed between the base layer and the reinforcing layer;
   a buffer layer disposed on the reinforcing layer; and
   first to seventh insulating layers sequentially stacked above the buffer layer.

3. The display device of claim 2, wherein:
   the transistors comprise first to seventh transistors;
   a semiconductor pattern included in each of the first transistor, the second transistor, the fifth transistor, the sixth transistor, and the seventh transistor is disposed on the buffer layer; and
   a semiconductor pattern included in each of the third transistor and the fourth transistor is disposed on a third insulating layer.

4. The display device of claim 3, wherein the semiconductor pattern of each of the first transistor, the second transistor, the fifth transistor, the sixth transistor, and the seventh transistor comprises the polysilicon.

5. The display device of claim 3, wherein the semiconductor pattern of each of the third transistor and the fourth transistor comprises the oxide.

6. The display device of claim 3, wherein:
   the first transistor, the second transistor, the fifth transistor, the sixth transistor, and the seventh transistor are P-type transistors; and
   the third transistor and the fourth transistor are N-type transistors.

7. The display device of claim 6, wherein:
   the reinforcing layer comprises first to third patterns arranged in a predetermined direction;
   each of the first pattern and the second pattern overlaps at least one selected from the P-type transistors; and
   the third pattern overlaps at least one selected from the N-type transistors.

8. The display device of claim 3, wherein the reinforcing layer does not overlap at least one selected from the second transistor, the third transistor, the fifth transistor, or the seventh transistor.

9. The display device of claim 3, wherein the first transistor is a driving transistor.

10. The display device of claim 1, wherein:
the light-emitting diode comprises a first electrode, a second electrode, and a light-emitting layer disposed between the first electrode and the second electrode;
the display layer comprises a pixel defining layer through which an opening is defined to expose at least a portion of the first electrode; and
the reinforcing layer overlaps a portion of the opening.

11. The display device of claim 10, further comprising:
a thin film encapsulation layer covering the light-emitting diode and disposed on the display layer,
wherein the thin film encapsulation layer comprises inorganic layers and an organic layer disposed between the inorganic layers.

12. The display device of claim 11, further comprising:
an input sensing layer disposed on the thin film encapsulation layer,
wherein the input sensing layer comprises sensing insulating layers and conductive patterns spaced apart from the opening and overlapping the pixel defining layer.

13. The display device of claim 12, wherein the reinforcing layer comprises a metal.

14. A display device comprising:
a base layer;
a reinforcing layer disposed on the base layer;
insulating layers disposed on the reinforcing layer;
transistors which are disposed between the insulating layers, wherein each of the transistors comprises a semiconductor pattern comprising a source, an active, a drain, and a gate, and at least one of the transistors is a P-type and the others of the transistors are N-types; and
a light-emitting diode connected to the transistors,
wherein a number of actives of the P-type transistors overlapping the reinforcing layer is greater than a number of actives of the N-type transistors overlapping the reinforcing layer.

15. The display device of claim 14, wherein insulating layers between which the semiconductor pattern included in the P-type transistors is disposed is different from insulating layers between which the semiconductor pattern included in the N-type transistors is disposed.

16. The display device of claim 15, wherein:
the transistors comprise first to seventh transistors;
the first transistor, the second transistor, the fifth transistor, the sixth transistor, and the seventh transistor are P-type transistors; and
the third transistor and the fourth transistor are N-type transistors.

17. The display device of claim 16, wherein:
the semiconductor pattern included in each of the P-type transistors comprises polysilicon; and
the semiconductor pattern included in each of the N-type transistors comprises oxide.

18. The display device of claim 16, wherein the reinforcing layer does not overlap at least one selected from the second transistor, the third transistor, the fifth transistor, and the seventh transistor.

19. The display device of claim 14, wherein the reinforcing layer comprises a metal.

20. The display device of claim 14, wherein:
the transistors and the light-emitting diode collectively define one pixel; and
shapes of portions of the reinforcing layer disposed in adjacent pixels are symmetrical to each other.

* * * * *